US010602610B2

(12) United States Patent
Kim et al.

(10) Patent No.: US 10,602,610 B2
(45) Date of Patent: Mar. 24, 2020

(54) PRINTED CIRCUIT BOARD AND ELECTRONIC DEVICE WITH THE SAME

(71) Applicant: Samsung Electronics Co., Ltd., Suwon-si, Gyeonggi-do (KR)

(72) Inventors: Man Ho Kim, Suwon-si (KR); Hwa Joong Jung, Osan-si (KR); Tae Yun Kim, Suwon-si (KR); Yong Hwan Choi, Suwon-si (KR); Ki Huk Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/835,223

(22) Filed: Dec. 7, 2017

(65) Prior Publication Data
US 2018/0168035 A1    Jun. 14, 2018

(30) Foreign Application Priority Data
Dec. 12, 2016 (KR) .......................... 10-2016-0168595

(51) Int. Cl.
*H05K 1/02* (2006.01)
*H05K 1/18* (2006.01)
(Continued)

(52) U.S. Cl.
CPC ....... *H05K 1/0298* (2013.01); *H01L 21/4857* (2013.01); *H01L 23/49822* (2013.01); *H05K 1/116* (2013.01); *H05K 1/181* (2013.01); *H05K 3/0047* (2013.01); *H05K 3/242* (2013.01); *H05K 3/282* (2013.01); *H01L 23/49811* (2013.01);
(Continued)

(58) Field of Classification Search
USPC ........................................................ 174/262
See application file for complete search history.

(56) References Cited

U.S. PATENT DOCUMENTS

2005/0128672 A1* 6/2005 Tourne ................. H05K 3/0047
                                                                361/119
2006/0090933 A1* 5/2006 Wig ....................... H05K 1/0216
                                                                174/262
(Continued)

FOREIGN PATENT DOCUMENTS

JP    08-153973 A      6/1996
JP    H08153973  *   6/1996 ............... H05K 3/46
JP    2015-185735 A   10/2015

OTHER PUBLICATIONS

International Search Report dated Feb. 28, 2018 in connection with International Patent Application No. PCT/KR2017/014018.
(Continued)

*Primary Examiner* — Stanley Tso

(57) ABSTRACT

According to an embodiment, a printed circuit board and an electronic device is disclosed. The printed circuit board includes a first pattern configured to be formed in a first layer. The printed circuit board also includes a second pattern configured to be formed in at least one second layer under the first layer. The printed circuit board also includes a via configured to electrically connect the first pattern to the second pattern. The printed circuit board further includes a recess configured to be formed by removing at least a portion of an area in which the via is formed and to electrically separate the first pattern from the second pattern.

20 Claims, 30 Drawing Sheets

(51) Int. Cl.
  *H05K 1/11*  (2006.01)
  *H05K 3/28*  (2006.01)
  *H05K 3/00*  (2006.01)
  *H05K 3/24*  (2006.01)
  *H01L 23/498* (2006.01)
  *H01L 21/48*  (2006.01)

(52) U.S. Cl.
  CPC ...... *H01L 23/49838* (2013.01); *H05K 3/0017* (2013.01); *H05K 2203/0207* (2013.01); *H05K 2203/175* (2013.01)

(56) References Cited

U.S. PATENT DOCUMENTS

| | | | |
|---|---|---|---|
| 2011/0269318 A1* | 11/2011 | Takeuchi | H05K 3/341 |
| | | | 439/65 |
| 2012/0012380 A1 | 1/2012 | Miller | |
| 2013/0199834 A1* | 8/2013 | De Geest | H05K 1/024 |
| | | | 174/266 |
| 2014/0305688 A1* | 10/2014 | Matsumoto | H05K 1/115 |
| | | | 174/262 |
| 2015/0047892 A1 | 2/2015 | Yang et al. | |
| 2015/0160701 A1* | 6/2015 | Bruno | H01L 23/13 |
| | | | 361/679.31 |
| 2015/0173201 A1* | 6/2015 | Robertson | H05K 3/0047 |
| | | | 29/852 |
| 2016/0190381 A1 | 6/2016 | Wu | |

OTHER PUBLICATIONS

European Patent Office, "Supplementary European Search Report," Application No. EP 17881975.1, dated Aug. 28, 2019, 6 pages.

* cited by examiner

PRINTED CIRCUIT BOARD AND ELECTRONIC DEVICE WITH THE SAME

CROSS-REFERENCE TO RELATED APPLICATION AND CLAIM OF PRIORITY

This application is related to and claims priority to Korean Patent Application No. 10-2016-0168595 filed on Dec. 12, 2016, the contents of which are incorporated herein by reference.

TECHNICAL FIELD

Various embodiments disclosed in the present disclosure relate to a printed circuit board configured to include a plurality of layers and an electronic device with the printed circuit board.

BACKGROUND

Pads disposed on a printed circuit board and exposed to the outside of the printed circuit board are surface-treated with an electrolytic plating (or an electrolytic Au plating) to improve reliability of the pads, to prevent the pads from oxidizing, or to perform a wire bonding on the pads.

For the electrolytic plating, an electroplating line (hereinafter, referred to as a "plating line") is required to be designed when designing the printed circuit board.

The plating line is removed by a process such as an etching process after the electrolytic plating is completed. However, a portion of the plating line remains and causes a signal interference or an electromagnetic interference.

SUMMARY

To address the above-discussed deficiencies, it is a primary object to provide a printed circuit board capable of electrically separating a plurality of patterns, which are connected to each other through a via, from each other using a recess and an electronic device with the printed circuit board.

In addition, an aspect of the present disclosure is to provide a printed circuit board including a first pattern formed in a first layer, a second pattern formed in at least one second layer under the first layer, a via electrically connecting the first pattern to the second pattern, and a recess formed by removing at least a portion of an area in which the via is formed to electrically separate the first pattern from the second pattern.

In accordance with an aspect of the present disclosure, a printed circuit board includes a first pattern configured to be formed in a first layer; a second pattern configured to be formed in at least one second layer under the first layer; a via configured to electrically connect the first pattern to the second pattern; and a recess configured to be formed by removing at least a portion of an area in which the via is formed and to electrically separate the first pattern from the second pattern.

In accordance with an aspect of the present disclosure, an electronic device includes a printed circuit board that mounts an integrated module thereon, a memory that stores instructions therein to control the integrated module, and a processor that is electrically connected to the integrated module to control the integrated module using the instructions. The printed circuit board includes a first pattern formed in a first layer, a second pattern formed in at least one second layer under the first layer, a via electrically connecting the first pattern to the second pattern, and a recess formed by removing at least a portion of an area in which the via is formed to electrically separate the first pattern from the second pattern.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

Throughout the drawings, it should be noted that like reference numbers are used to depict the same or similar elements, features, and structures.

DETAILED DESCRIPTION

FIGS. 1 through 12, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

The terms of a singular form may include plural forms unless otherwise specified. In the present disclosure, the expressions "A or B", "at least one of A and/or B", "A, B, or C", or at least one of "A, B and/or C" may include all possible combinations of one or more of the associated listed items. The terms such as "first", "second", and the like used herein may refer to various elements regardless of the order and/or priority of the elements and may be used to distinguish an element from another element, not to limit the elements. It will be understood that when an element (e.g., a first element) is referred to as being "(operatively or communicatively) coupled with/to" or "connected to" another element (e.g., a second element), the element may be directly coupled with/to or connected to the another element or an intervening element (e.g., a third element) may be present there between.

In the present disclosure, according to the situation, the expression "adapted to or configured to" used herein may be interchangeably used with, for example, the expression "suitable for", "having the capacity to", "changed to", "made to", "capable of", or "designed to" "adapted to", "made to", or "capable of". Under a certain situation, the expression "a device configured to" may mean that the device is "capable of" operating together with another device or other components. For example, a "processor configured to (or adapted to) perform A, B, and C" may mean a dedicated processor (e.g., an embedded processor) for performing a corresponding operation or a generic-purpose processor (e.g., a central processing unit (CPU) or an application processor) which may perform corresponding operations by executing one or more software programs which are stored in a memory device.

Figure 1:
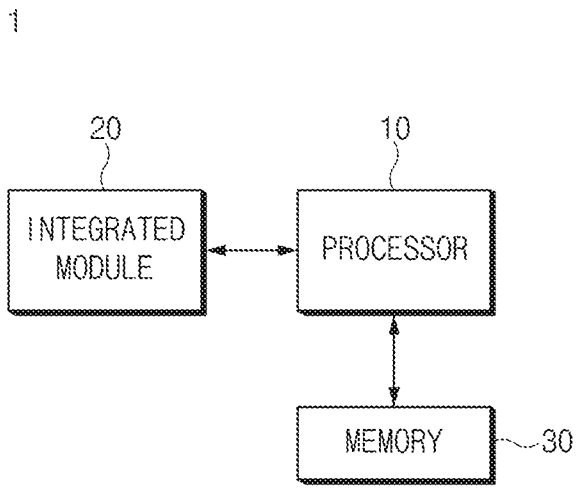
FIG. 1 illustrates a block diagram showing a configuration of an electronic device according to an embodiment of the present disclosure.

FIG. 1 illustrates a block diagram showing a configuration of an electronic device according to an embodiment of the present disclosure.

Referring to FIG. 1, an electronic device 1 according to an embodiment may include a memory 30, a processor 10, and an integrated module 20. According to an embodiment, the memory 30, the processor 10, and the integrated module 20 may be mounted on at least one printed circuit board by an SMT process.

According to an embodiment, the memory 30 may store instructions to control the integrated module 20. The memory 30 may be, for example, a volatile memory, such as an RAM, etc., a non-volatile memory, such as an ROM, a flash memory, etc., or a combination thereof.

According to an embodiment, the processor 10 may be electrically connected to the memory 30 and the integrated module 20. The processor 10 may control the integrated module 20 using the instructions stored in the memory 30. For instance, the processor 10 may include at least one of a central processing unit (CPU), a graphic processing unit (GPU), a microprocessor, a digital signal processor (DSP), an application processor (AP), or various custom semiconductors (e.g., an application specific integrated circuit (ASIC), field programmable gate arrays (FPGA)) and may include a plurality of cores.

According to an embodiment, the integrated module 20 may be a hardware module to execute a specific function. For instance, the integrated module 20 may be a hardware module, such as a camera module, a memory, a processor, a melody IC, an LCD driver IC, a power IC, etc., which executes various functions. The integrated module 20 may be manufactured by a semiconductor process. In an embodiment, the integrated module 20 may be configured with at least one component element. The at least one component element may include, for example, at least one of a processor, an image sensor, a memory, a switching device (e.g., an FET, a transistor, etc.), or a passive device (e.g., a resistor, a capacitor, a transistor, etc.). At least a portion of the integrated module 20 may be mounted on a printed circuit board 200 (refer to FIG. 2). The printed circuit board 200 (refer to FIG. 2) may be, for example, a semiconductor substrate to which each of the component elements is wire-bonded or a substrate on which the processor 10, the memory 30, and the integrated module 20 are mounted by the SMT process.

Figure 2:
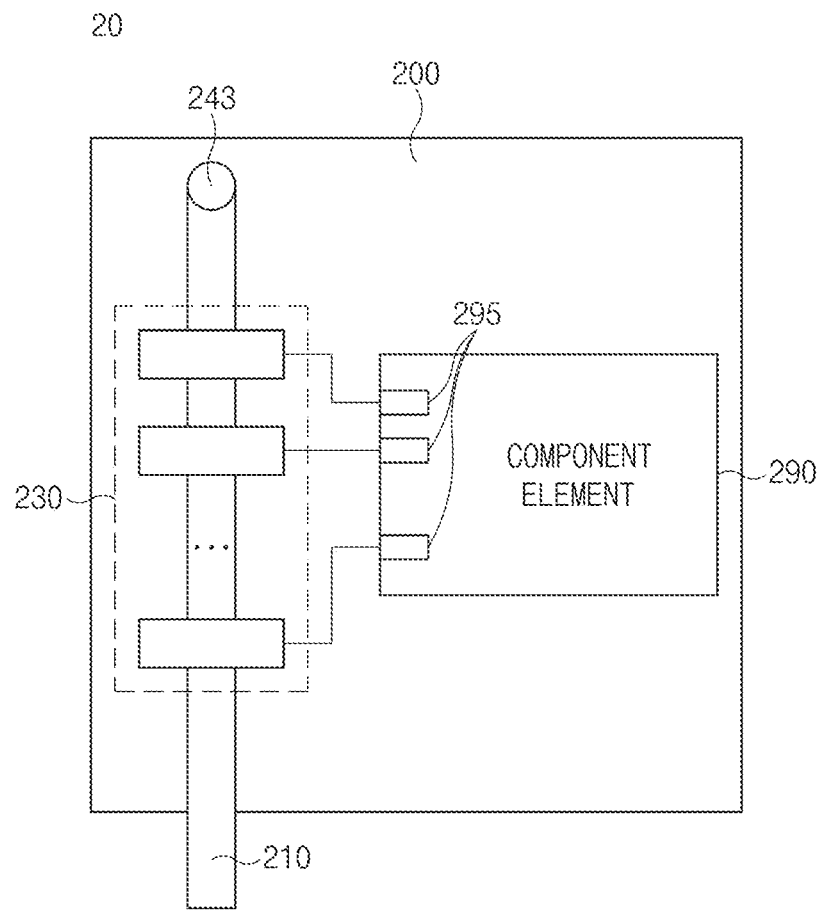
FIG. 2 illustrates a block diagram showing an integrated module according to an embodiment of the present disclosure.
Figure 3A:
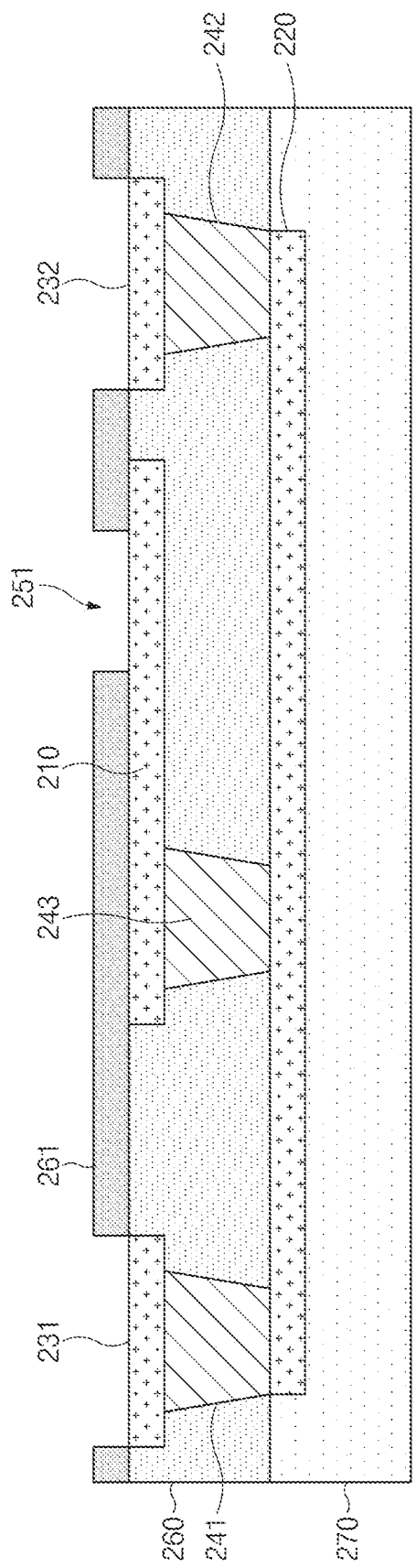
FIGS. 3A and 3D illustrate side views showing a printed circuit board of an integrated module according to an embodiment of the present disclosure.
Figure 3B:
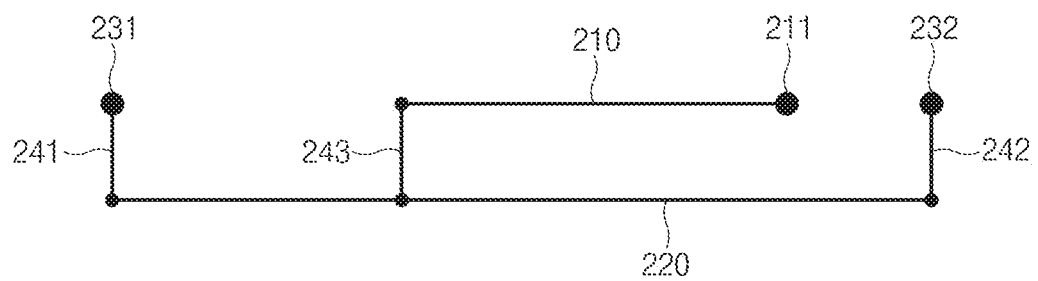
FIGS. 3B and 3E illustrate equivalent circuit diagrams showing a printed circuit board according to an embodiment of the present disclosure.
Figure 3C:
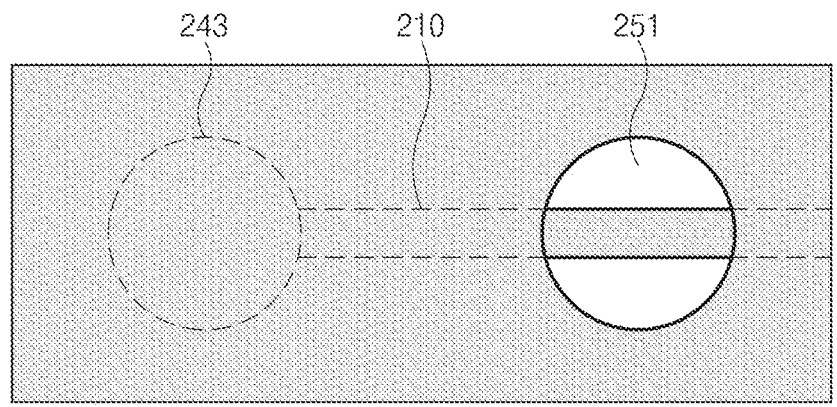
FIGS. 3C and 3F illustrate top views showing a printed circuit board according to an embodiment of the present disclosure.
Figure 3D:
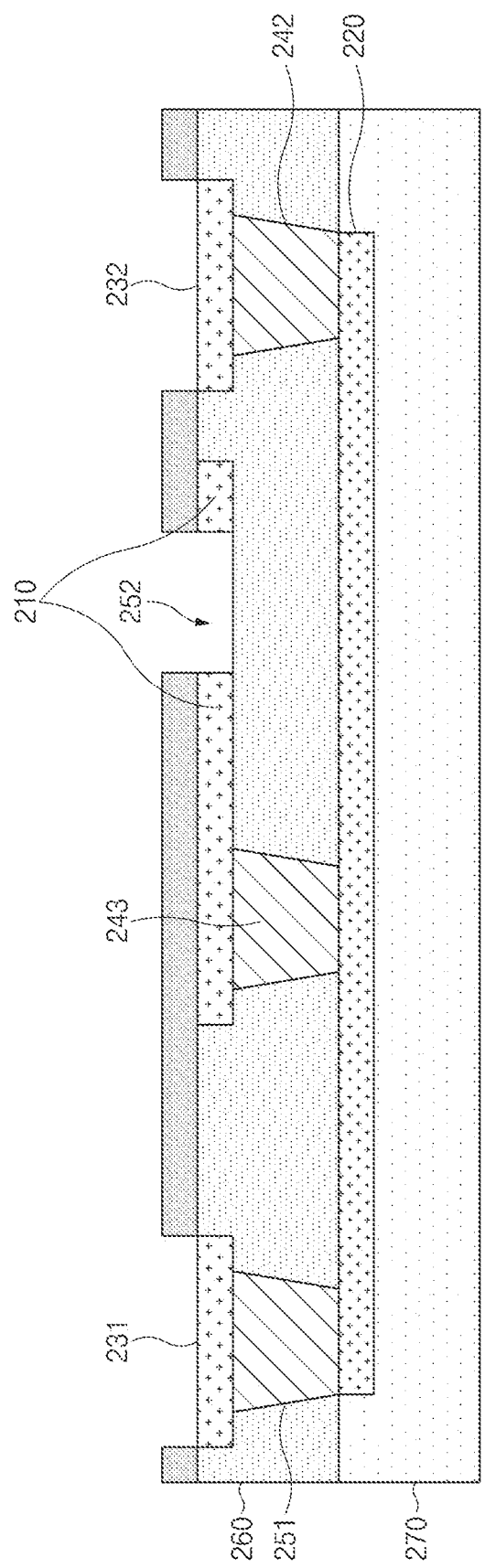
Figure 3E:
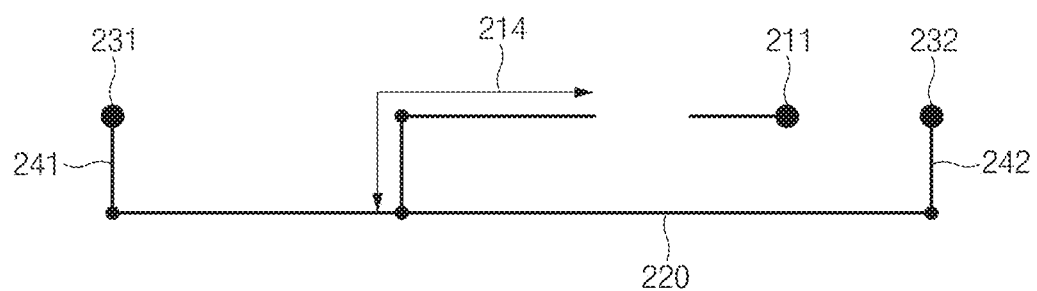
Figure 3F:
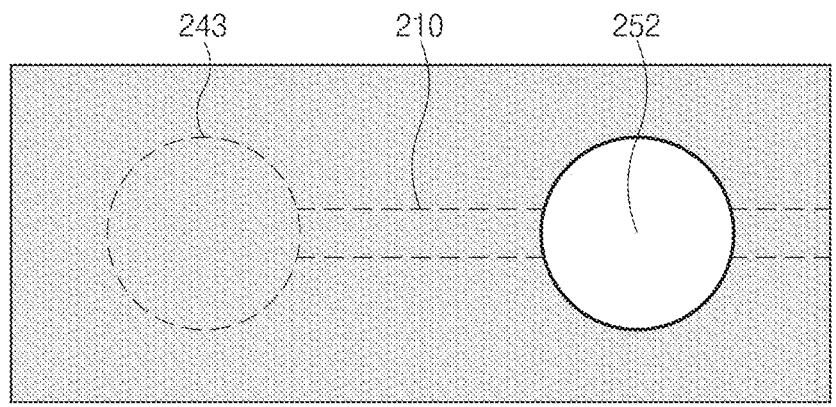

FIG. 2 of the present disclosure a block diagram showing an integrated module according to an embodiment of the present disclosure, FIGS. 3A and 3D illustrate side views showing a printed circuit board of an integrated module according to an embodiment of the present disclosure, FIGS. 3B and 3E illustrate equivalent circuit diagrams showing a printed circuit board according to an embodiment of the present disclosure, and FIGS. 3C and 3F illustrate top views showing a printed circuit board according to an embodiment of the present disclosure. For the convenience of explanation, FIGS. 3A to 3F show two layers of the printed circuit board, but the number of the layers of the printed circuit board should not be limited to two.

Referring to FIG. 2, the integrated module 20 may include the at least one component element 290 and the printed circuit board 200. For the convenience of explanation, FIG. 2 shows a case in which the integrated module 20 includes one component element 290 as a representative example, but the number of the component elements should not be limited to one.

According to an embodiment, the at least one component element 290 may include a component forming the integrated module 20 that implements a specific function. The at least one component element 290 may include at least one pin 295 that is wire-bonded. Each pin of the component element 290 may be wire-bonded on a pad 230 of the printed circuit board 200. The pins 295 of the component elements may be connected to each other through a pattern and a via on the printed circuit board 200. For instance, each pin 295 of each component element 290 may be electrically connected to another pin of at least another component element through the pad 230, the pattern, and the via on the printed circuit board 200. The component element 290 may include, for example, at least one of the processor, the image sensor, the memory, the switching device (e.g., the FET, the transistor, etc.), or the passive device (e.g., the resistor, the capacitor, the transistor, etc.).

In an embodiment, the printed circuit board 200 may include a plurality of pads 230, a signal line 220 (refer to FIG. 3A), a first pattern 210, and a via 243. The pads 230 may be wire-bonded to the pins of the component element 290, respectively. The pads 230 may be disposed on an outer layer (e.g., a top layer, a bottom layer, etc.) of the printed circuit board 200. The signal line may be a routing pattern that electrically connects the pads 230 of the at least one component element 290 to the pins 295, respectively, such that each function of the integrated module 20 is implemented. The first pattern 210 may be, for example, a plating line branched from the signal line to electroplate (e.g., a soft electroplating) each pad 230. For instance, the first pattern 210 may be generated by using at least one signal line 220 (e.g., a portion of the first pattern 210) (e.g., a ground) of the printed circuit board 200 and may include a dummy line to apply a current to the signal lines 220 on the printed circuit board 200 in batches. At least a portion of the dummy line of the first pattern 210 may be removed after the electrolytic plating is performed. Since the at least portion of the dummy line is removed, the dummy line may be electrically separated from the signal line 220. For instance, the dummy line may be removed by an etching process or a drill process.

In an embodiment, a first end 211 of the first pattern 210 may be disposed on the outer layer of the printed circuit board 200 as a current application point for the electrolytic Au plating. At least a portion of the signal line 220 connected to the at least one pad 230 may be disposed on at least one of the outer layer or an inner layer of the printed circuit board 200. In a case that the signal line 220 connected to each pad 230 is disposed in the inner layer of the printed circuit board 200, the first pattern 210 may be connected to the signal line 220 through the via 243.

Referring to FIGS. 3A to 3C, the printed circuit board 200 may include at least two layers (e.g., 260 and 270), and the printed circuit board 200 may include a first pad 231, a second pad 232, a plurality of vias 241, 242, and 243, the signal line 220, and the first pattern 210. The first pad 231 and the second pad 232 may be pads wire-bonded to each pin of the at least one component element 290. For instance, the first and second pads 231 and 232 may be pads connected to two pins included in one component element or pads connected to two pins respectively included in different component elements. In an embodiment, the first pad 231 of the printed circuit board 200 may be connected to the second pad 232 through a first via 241, a first pattern 210, and a second via 242.

The signal line 220 may be disposed in the inner layer 270 of the printed circuit board 200 and connected to the first and second pads 231 and 232 through the first and second vias 241 and 242. The first pattern 210 may be connected to the signal line 220 through a third via 243, and thus the plating line may be connected to the first and second pads 231 and 232. Due to the connection structure, when the current is applied to the first pattern 210 through the first end 211 of the first pattern 210, the current may be applied to the first and second pads 231 and 232 through the vias 241, 242, and 243 and the signal line 220, and thus the first and second pads 231 and 232 may be electroplated. Since a process in which the first pattern 210 is electroplated by immersing the electroplating line in an electrolyte solution may be derived from known technologies by a person skilled in the art, details thereof will be omitted.

In an embodiment, a first area 251 may be formed at a portion of an upper end of the first pattern 210 in the outer layer 260 of the printed circuit board 200 to etch the first pattern 210. A solder resist 261 may not be formed in the first area 251 such that the first pattern 210 is disconnected by the etching process. Accordingly, when the etching process is performed on the printed circuit board 200, i.e., when the printed circuit board 200 is immersed in an etching solution, the plating line may be etched in the first area 251. As a result, a first recess 252 may be formed in the first area 251.

As shown in FIGS. 3D to 3F, when the etching process is performed on the first area 251 of the printed circuit board 200, the electroplating line placed in the first area 251 may be etched, and thus the first recess 252 may be formed in the first area 251. In an embodiment, since the first pattern 210 remains on the printed circuit board 200 in an area except for the area at which the first recess 252 is placed, a second area 214 of the electroplating line extending from the signal line 220 and remaining on the printed circuit board 200 may serve as a stub, and thus noises may be introduced into the signal line 220. As described above, as a length of the second area 214 decreases, it is advantageous to prevent the noises from being introduced.

Figure 4A:
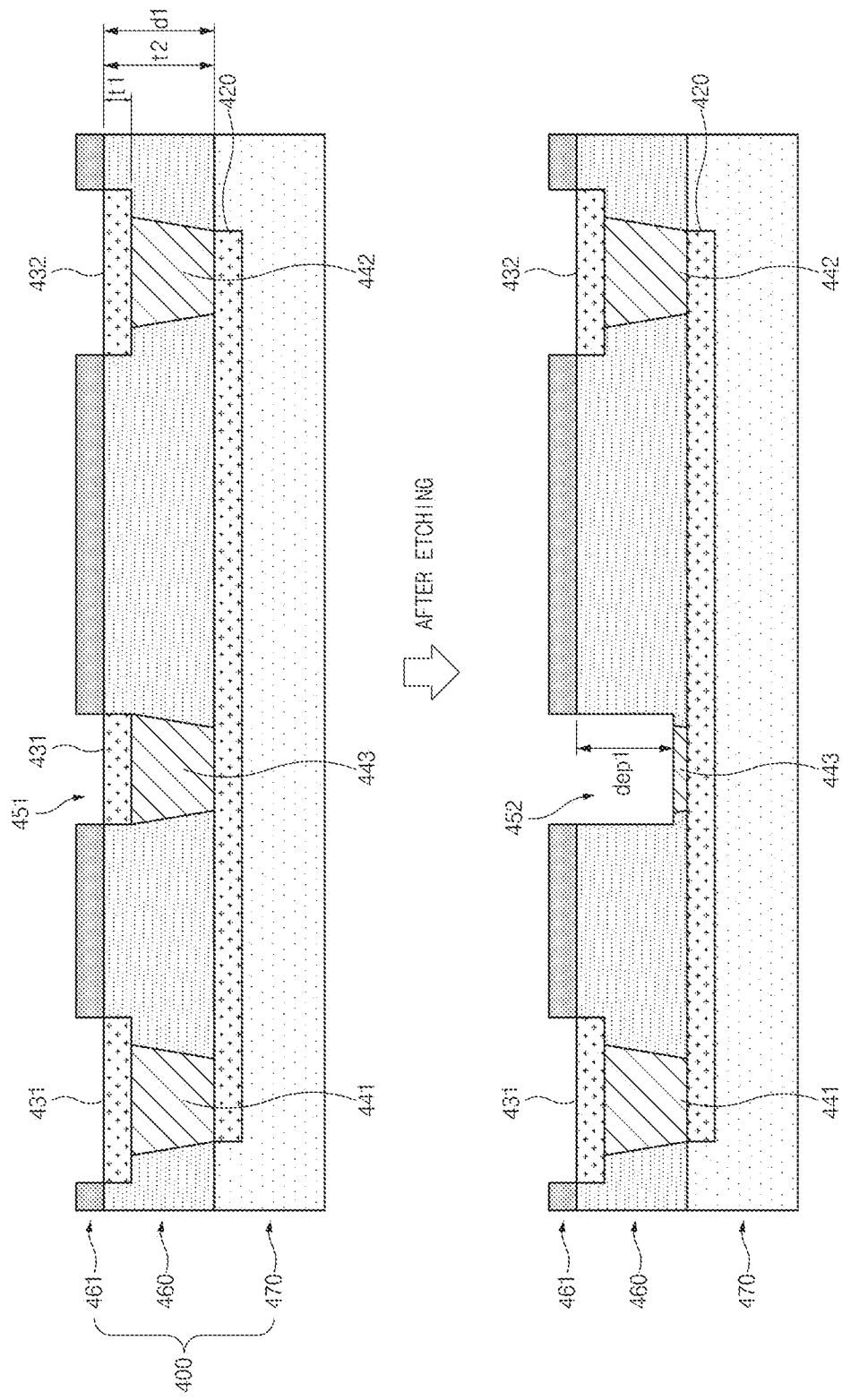
FIGS. 4A through 4C illustrate views showing a printed circuit board according to an embodiment of the present disclosure.
Figure 4B:
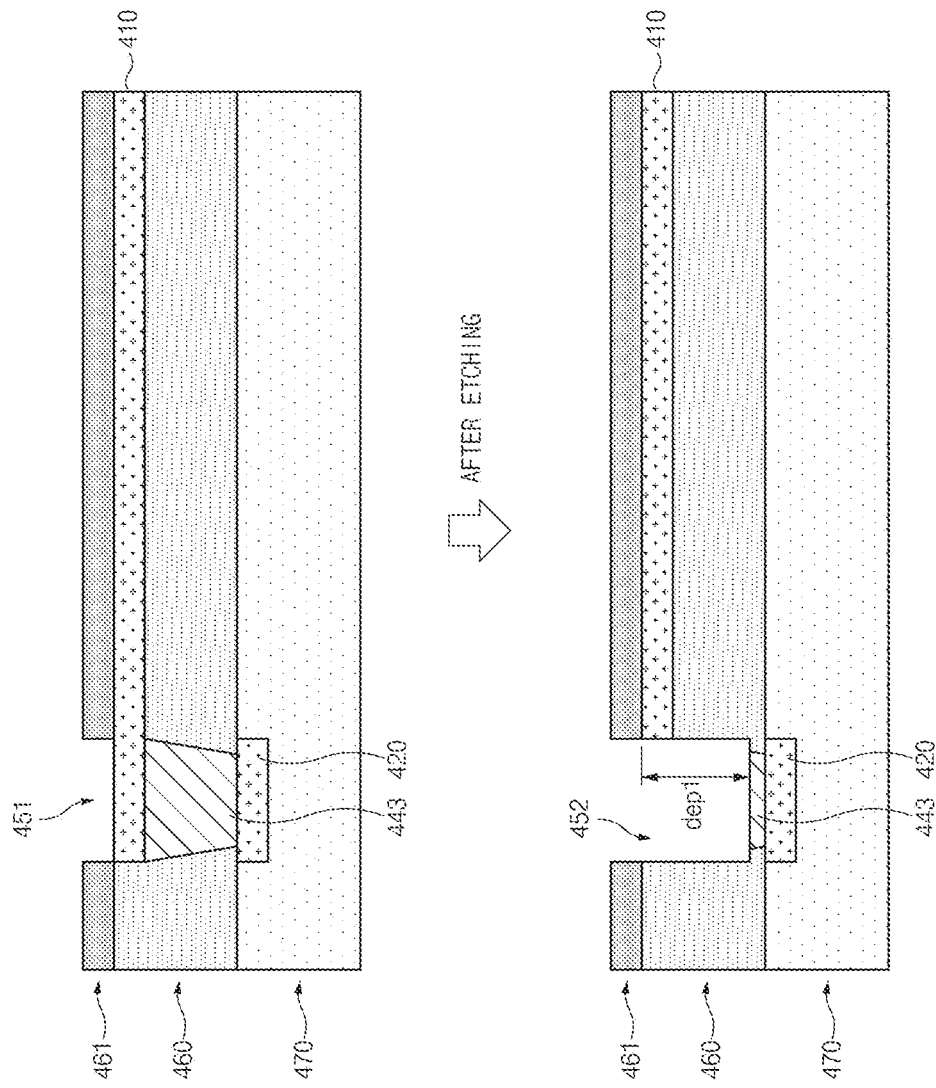
Figure 4C:
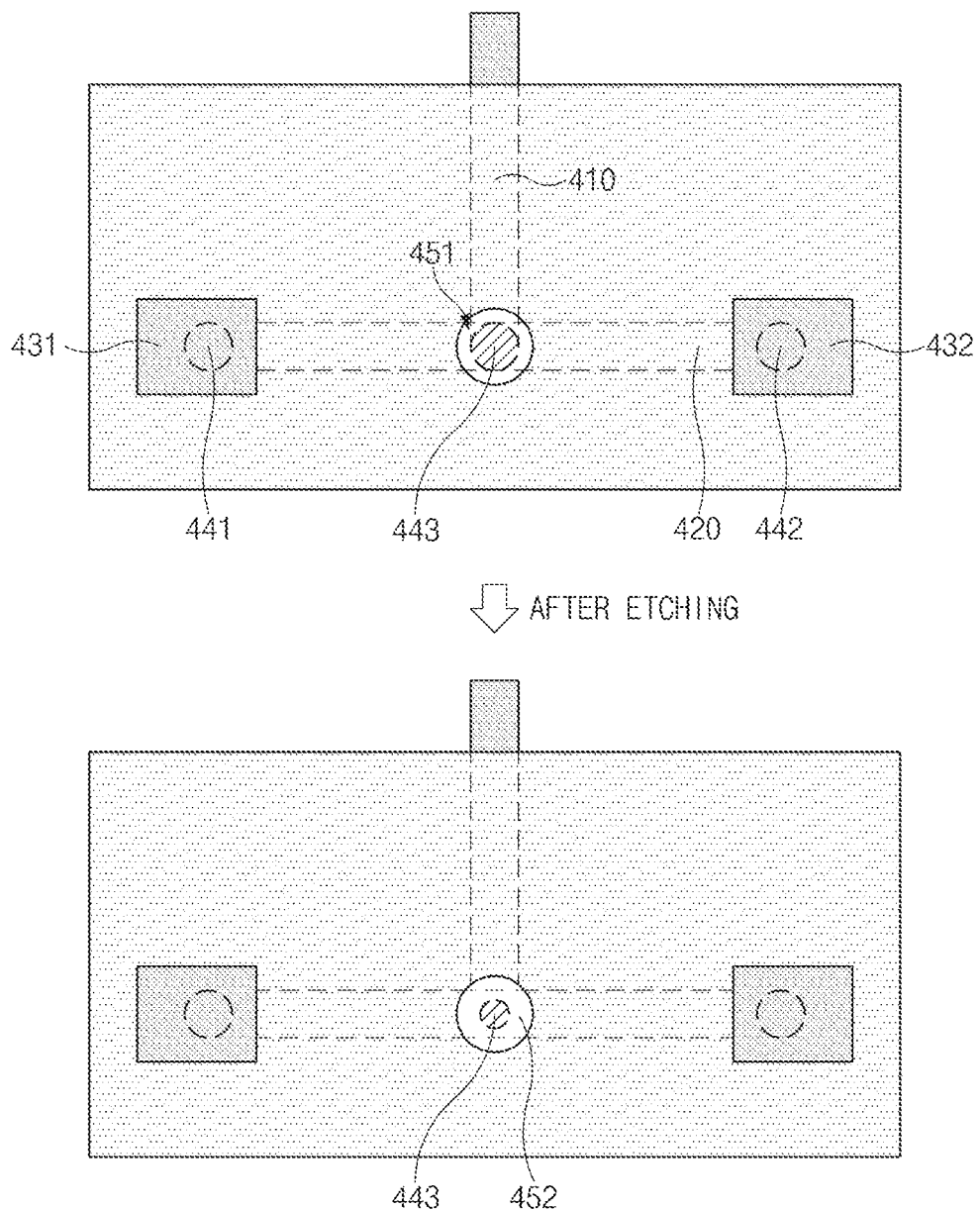

FIGS. 4A and 4B illustrate views showing a printed circuit board according to an embodiment of the present disclosure. FIG. 4A is a cross-sectional view showing a first side surface of a printed circuit board according to an embodiment, FIG. 4B is a cross-sectional view showing a second side surface of the printed circuit board, which is substantially perpendicular to the first side surface according to an embodiment, and FIG. 4C is a top view showing the printed circuit board according to an embodiment. FIGS. 4A to 4C show the printed circuit board before and after performing an etching process according to an embodiment. There are different features in the etching of the electroplating line between FIGS. 4A to 4C and FIGS. 3A to 3F, and thus, hereinafter the different features will be mainly described.

Referring to FIGS. 4A to 4C, the printed circuit board 400 may include a first pad 431, a second pad 432, a first pattern 410, a second pattern 420, a via 443, and a recess 452. The printed circuit board 400 may include a plurality of pads wire-bonded to the component element 290. However, for the convenience of explanation, FIGS. 4A and 4B show a case in which the printed circuit board 400 includes two pads as a representative example. In addition, FIGS. 4A and 4B show some layers (first and second layers) of the printed circuit board 400 as a representative example, but the number of the layers of the printed circuit board 400 should not be limited thereto or thereby.

In an embodiment, the printed circuit board 400 may have a stack structure of at least two layers including an upper layer 460 and a lower layer 470. In an embodiment, each layer of the printed circuit board 400 may be formed by attaching a thin plate to one surface of an insulating plate, etching the thin plate along a circuit pattern (e.g., 420), and forming a via hole (e.g., 443). Accordingly, the printed circuit board 400 may have a structure in which the insulating plate (e.g., a phenol resin) and the thin plate (e.g., a copper plate) are alternately stacked with each other. In an embodiment, an insulating material 461 (e.g., a solder resist), such as a solder resist, may be coated on outer layers (a top layer and a bottom layer) of the printed circuit board 400.

As shown in FIGS. 4A and 4B, the upper layer 460 may be the outer layer, and the lower layer 470 may be the inner layer or the outer layer. For instance, in a case that the upper layer 460 is the top layer, the lower layer 470 may be the inner layer or the bottom layer. As described above, the present embodiment may be applied to not only the via formed through the outer layer and the inner layer but also the via formed between the outer layers. However, for the convenience of explanation, FIG. 4A shows the upper layer corresponding to the outer layer and the lower layer corresponding to the inner layer.

According to an embodiment, the first and second pads 431 and 432 may be pads connected to each pin of the at least one component element 290 by a wire-bonding method. For instance, the first and second pads 431 and 432 may be pads connected to two pins included in one component element or pads connected to two pins respectively included in different component elements. In an embodiment, the first pad 431 of the printed circuit board 400 may be connected to the second pad 432 through a first via 441, the first pattern 410, and a second via 442.

According to an embodiment, the first pattern 410 may be a pattern that applies a current to a pad, which is wire-bonded and electroplated, of an integrated module 20 including the first pad 431 and the second pad 432. At least a portion of the first pattern 410, for example, a first end 411 of the first pattern 410 may be disposed on the outer layer 460 of the printed circuit board 400. The first pattern 410 may be a pattern having a wide width, such as a ground, a power line, etc.

According to an embodiment, the second pattern 420 may be a routing pattern to electrically connect the first pad 431 to the second pad 432. The second pattern 420 may be branched from the first pattern 410, which is connected to the first pad 431 and the second pad 432, through the via 443 and electrically connected to the first pattern 410. As shown in FIGS. 4A and 4B, the second pattern 420 may be formed in the inner layer 470 of the printed circuit board 400 and connected to the first pad 431 and the second pad 432 through the first and second vias 441 and 442.

According to an embodiment, the via 443 may electrically connect the second pattern 420 placed in the lower layer 470 of the printed circuit board 400 to the first pattern 410 placed in the upper layer 460 of the printed circuit board 400. For instance, the via 443 may be a thru-hole via that vertically connects the upper layer 460 of the printed circuit board 400 to the lower layer 470 of the printed circuit board 400 or a staggered via that connects the upper layer 460 of the printed circuit board 400 to the lower layer 470 of the printed circuit board 400 in a zigzag shape. As described above, the embodiment may employ a variety of vias.

According to an embodiment, the recess 452 may be formed in the printed circuit board 400 by removing at least a portion of the printed circuit board 400 in an area in which the via 443 is formed, and thus the first pattern 410 may be electrically separated from the second pattern 420. In an embodiment, the via 443 may be formed by filling a conductive material in a hole penetrating through at least a portion of the first pattern 410 of the upper layer 460 and at least a portion of the second pattern 420 of the lower layer 470, and thus the via 443 may electrically connect the first pattern 410 to the second pattern 420. In an embodiment, the recess 452 may be formed in the via 443 to have a size and a shape, which are appropriate to remove the conductive material in the hole of the via 443 to electrically separate the first pattern 410 from the second pattern 420.

According to an embodiment, the first pattern 410 may be disconnected by the recess 452 or may not be disconnected. For instance, in a case that the first pattern 410 has a width exceeding a diameter of the recess 452, the recess 452 may not disconnect the first pattern 410. The first pattern 410 having the width exceeding the diameter of the recess 452 may be a power line and a ground. As another example, in a case that the width of the first pattern 410 is equal to or smaller than the diameter of the recess 452, the recess 452 may disconnect the first pattern 410. Since the largest number of the grounds and the power lines are disposed on the printed circuit board 400, the number of the dummy lines for the plating may be reduced in the case that the ground and the power line are used as the first pattern 410.

According to an embodiment, the recess 452 may be formed in the printed circuit board 400 through various processes. For instance, the recess 452 may be formed by etching a portion of the via 443 formed in the upper layer 460 of the printed circuit board 400 through an etching process (e.g., an etch back process). The recess 452 may be formed by a drill process that irradiates a laser beam on an upper portion (a portion formed on the outer layer) of the via 443. As described above, the recess according to the embodiment may be applied to the printed circuit board 400 through various processes.

Referring to the via 443 before being etched as shown in FIGS. 4A to 4C, the second pattern 420 may be connected to the first pad 431 and the second pad 432 through the first via 441 and the second via 442, and the first pattern 410 may be connected to the second pattern 420 through the via 443. As shown in FIGS. 4A to 4C, the insulating material 461 may be coated on a portion of the upper layer of the printed circuit board 400, which is not soldered. However, the insulating material 461 may not be coated on a first area 451 of the upper layer 460 placed above the via 443 according to the embodiment. In the present disclosure, a structure in which the insulating material 461 is not coated on the upper end of the via 443 will be described as a representative example.

Referring to the via 443 after being etched as shown in FIGS. 4A to 4C, when the first area 451 of the printed circuit board 400 is etched by a process such as the etch back process, the recess 452 may be formed in the first area 451 on the via 443 to separate the first pattern 410 from the second pattern 420. As described above, according to the embodiment, since a branch point at which the dummy line for the plating (e.g., 410) is branched from the signal line (e.g., 420) is disconnected, a length (e.g., about 0.1 mm) of the plating line connected to the signal line may be significantly reduced, and thus the noises and signal attenuation, which are caused by the plating line, may be prevented from occurring on the signal line.

In an embodiment, a depth of the recess 452 may be determined depending on the etching solution and an etching time. Referring to FIGS. 4A and 4B, the recess 452 may be formed to have a depth appropriate to remove the area placed in the upper layer 460 of the via 443. For instance, a depth dep1 of the recess 452 may be equal to or greater than a thickness t1 of the first pattern 410 of the printed circuit board 400 and equal to or smaller than a total thickness t2 of the upper layer 460 of the printed circuit board 400. As another way, the depth dep1 of the recess 452 may be equal to or greater than the thickness t1 of the first pattern 410 and equal to or smaller than a distance d1 between an upper surface of the first pattern 410 and an upper surface of the second pattern 420. The former example may be easier to carry out than the latter example, and the latter example may more reduce the introduction of the noises, which is caused by the first pattern 410, than the former example. In an embodiment, each of the patterns 410 and 420 of the printed circuit board 400 may correspond to a thickness of the thin plate of each layer of the printed circuit board 400. The thickness of each layer of the printed circuit board 400 may correspond to a thickness including the thin plate and the insulating plate of each layer of the printed circuit board 400. In the present disclosure, since the structure in which the insulating material 461 is not coated on the upper end of the recess 452 is described, the depth of the recess 452 is calculated without considering the insulating material 461. Accordingly, in a case that the insulating material 461 is coated on the upper end of the recess 452, the depth of the recess 452 may increase by a thickness of the insulating material 461.

FIGS. 4A and 4B show the structure in which the second pattern 420 is formed in the inner layer 470 of the printed circuit board adjacent to the upper layer 460 of the printed circuit board and the total thickness t2 of the upper layer 460 of the printed circuit board is equal to the distance d1 between the upper surface of the upper layer and the upper surface of the second pattern 420, but it should not be limited thereto or thereby. The insulating material may be coated on the upper end of the recess 452 by an additional process. Accordingly, the via 443 in the recess 452 may be prevented from being exposed in the present embodiment.

In an embodiment, in the case that the signal line is disposed on a different layer from and connected to the plating line through the via, the length of the plating line connected to the signal line may be significantly reduced by etching the portion of the via at the branch point at which the plating line is branched from the signal line. Accordingly, the introduction of the noises, which is caused by the plating line, may be improved in the present embodiment.

According to an embodiment, the first pattern 410 may be the signal line rather than the dummy line for the plating. As an example, in a case that the first pattern 410 on the outer layer of the printed circuit board is separated from the second pattern 420 on at least one lower layer of the printed circuit board due to a process error on the printed circuit board 400, the first pattern 410 and the second pattern 420 may be electrically separated from each other by the recess 452.

According to an embodiment, the printed circuit board 400 may be a printed circuit board of an electronic device 1 rather than the semiconductor substrate as described above. In this case, the first and second pads 431 and 432 may be connected to each pin of the component element 290 through the routing pattern.

Figure 5A:
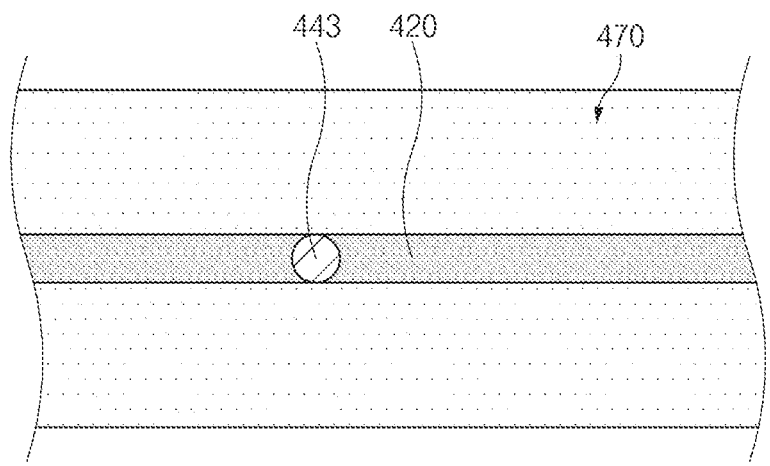
FIG. 5A illustrates a view showing a structure in which a via of a lower layer of a printed circuit board is connected to a second pattern according to an embodiment of the present disclosure.
Figure 5B:
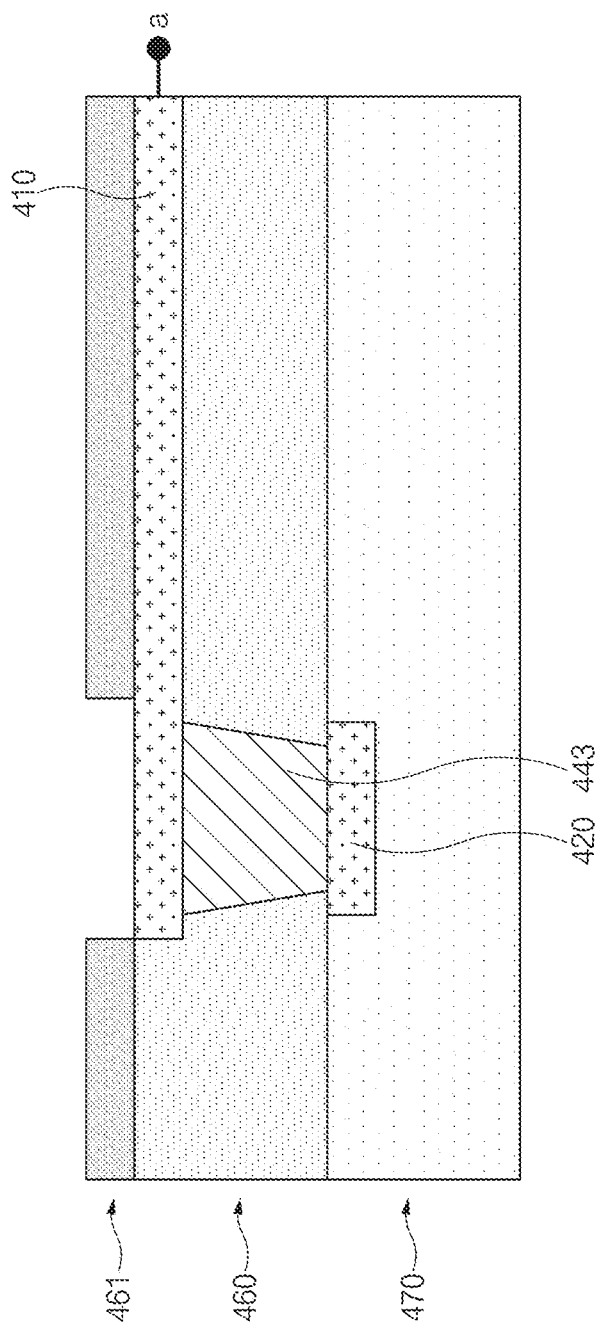
FIG. 5B illustrates a cross-sectional view showing a printed circuit board having a structure in which a via is connected to a second pattern according to an embodiment of the present disclosure.
Figure 5C:
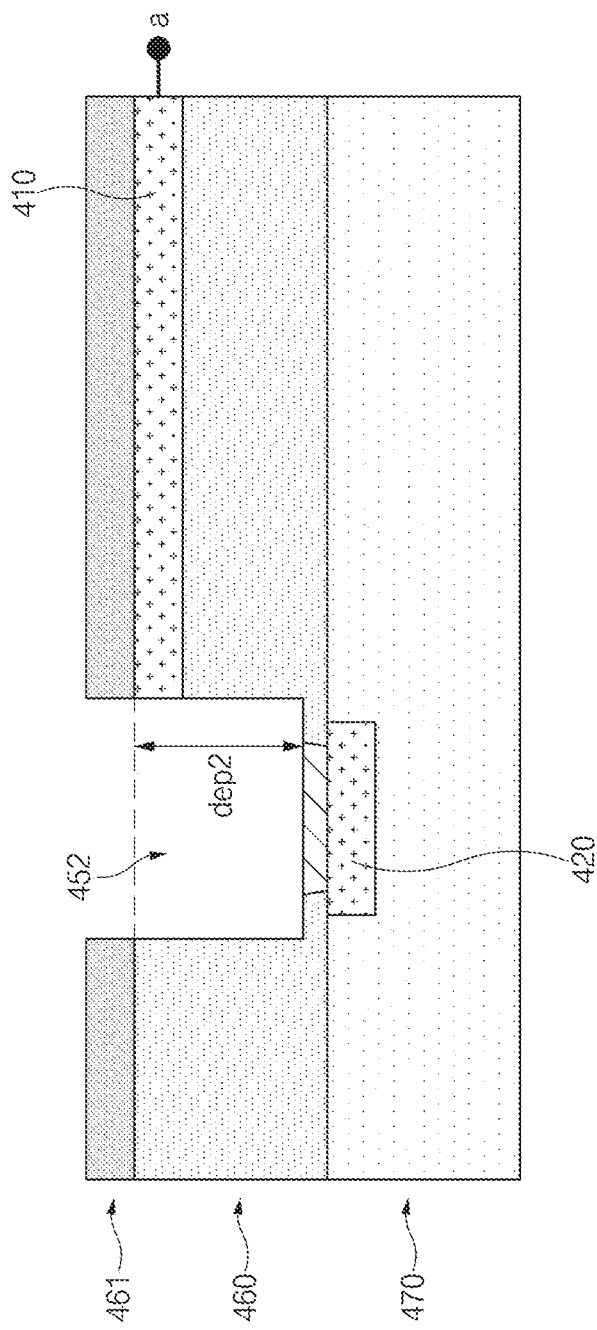
FIG. 5C illustrates a cross-sectional view showing a printed circuit board to explain a depth of a recess formed in at least a portion of a via according to an embodiment of the present disclosure.

FIG. 5A illustrates a view showing a structure in which a via of a lower layer of a printed circuit board is connected to a second pattern according to an embodiment of the present disclosure, FIG. 5B illustrates a cross-sectional view showing a printed circuit board having a structure in which a via is connected to a second pattern according to an embodiment of the present disclosure, and FIG. 5C illustrate as a cross-sectional view showing a printed circuit board to explain a depth of a recess formed in at least a portion of a via according to an embodiment of the present disclosure.

Figure 6A:
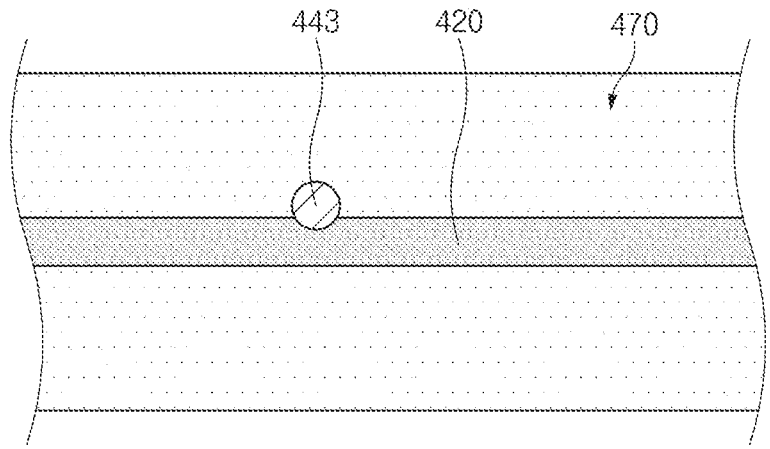
FIG. 6A illustrates a view showing a structure in which a via of a lower layer of a printed circuit board is connected to a second pattern according to an embodiment of the present disclosure.
Figure 6B:
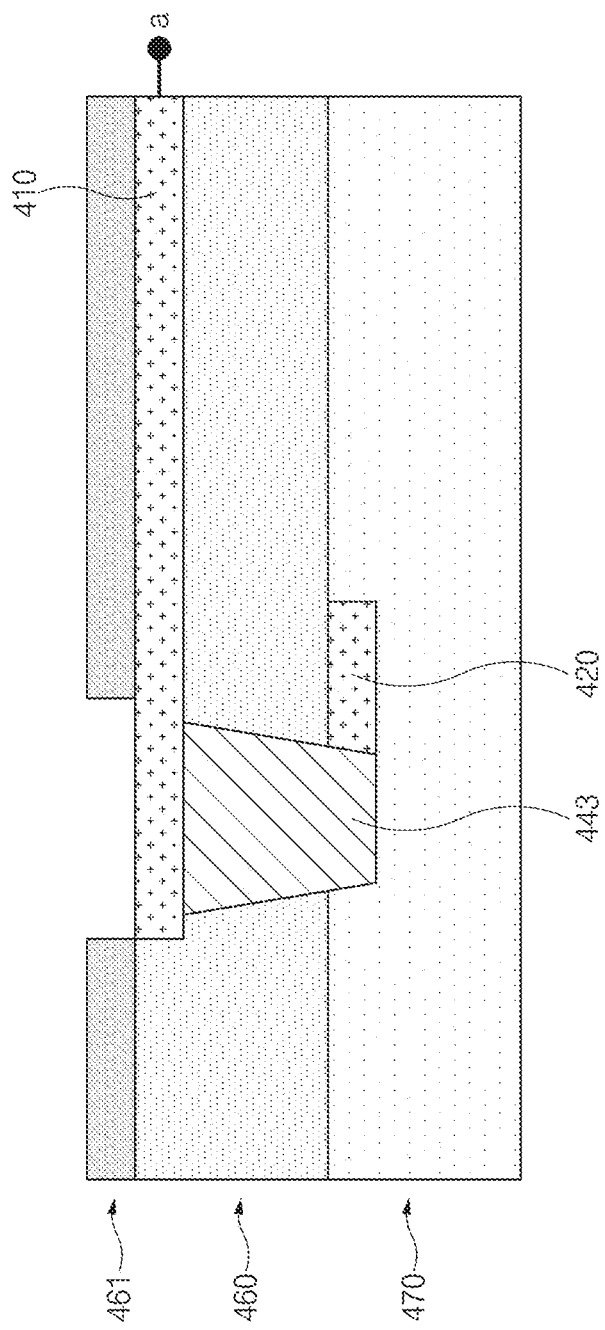
FIG. 6B illustrates a cross-sectional view showing a printed circuit board having a structure in which a via is connected to a second pattern according to an embodiment of the present disclosure.
Figure 6C:
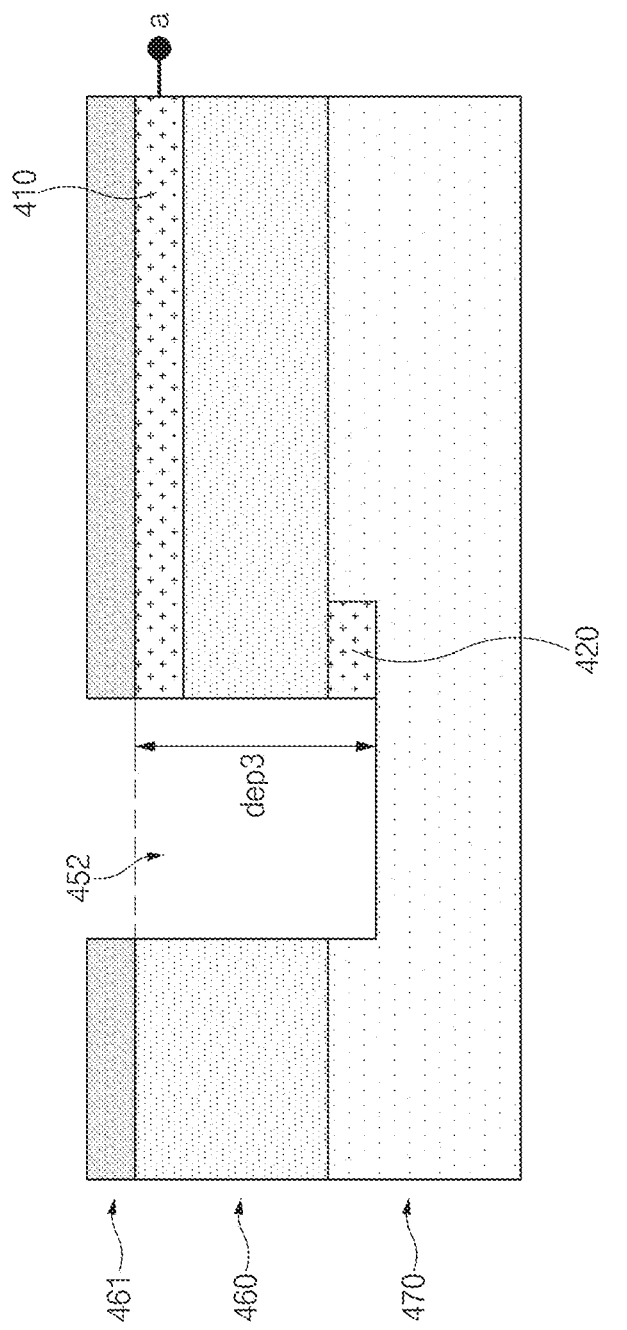
FIG. 6C illustrates a cross-sectional view showing a printed circuit board to explain a depth of a recess formed in at least a portion of a via according to an embodiment of the present disclosure.
Figure 7A:
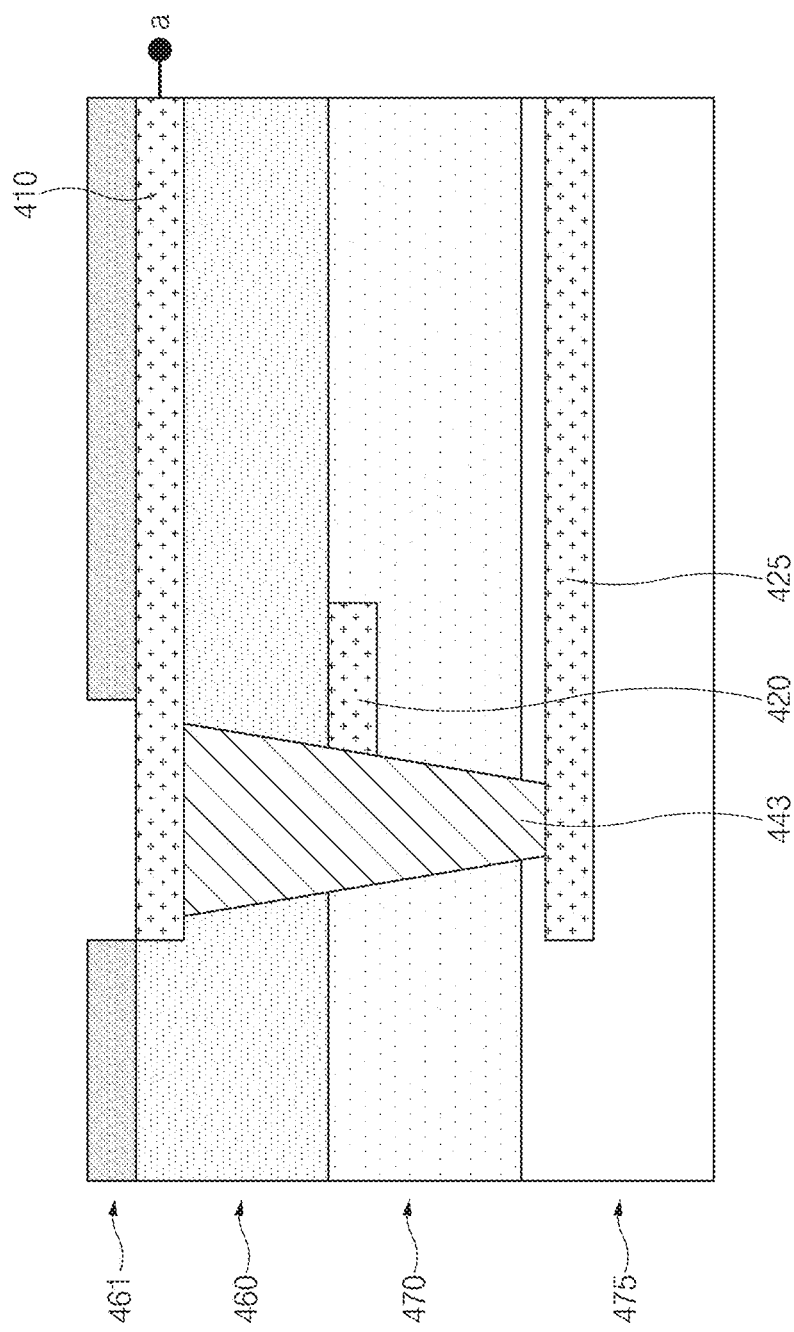
FIG. 7A illustrates a cross-sectional view showing a printed circuit board having a structure in which a via is connected to first, second, and third patterns according to an embodiment of the present disclosure.
Figure 7B:
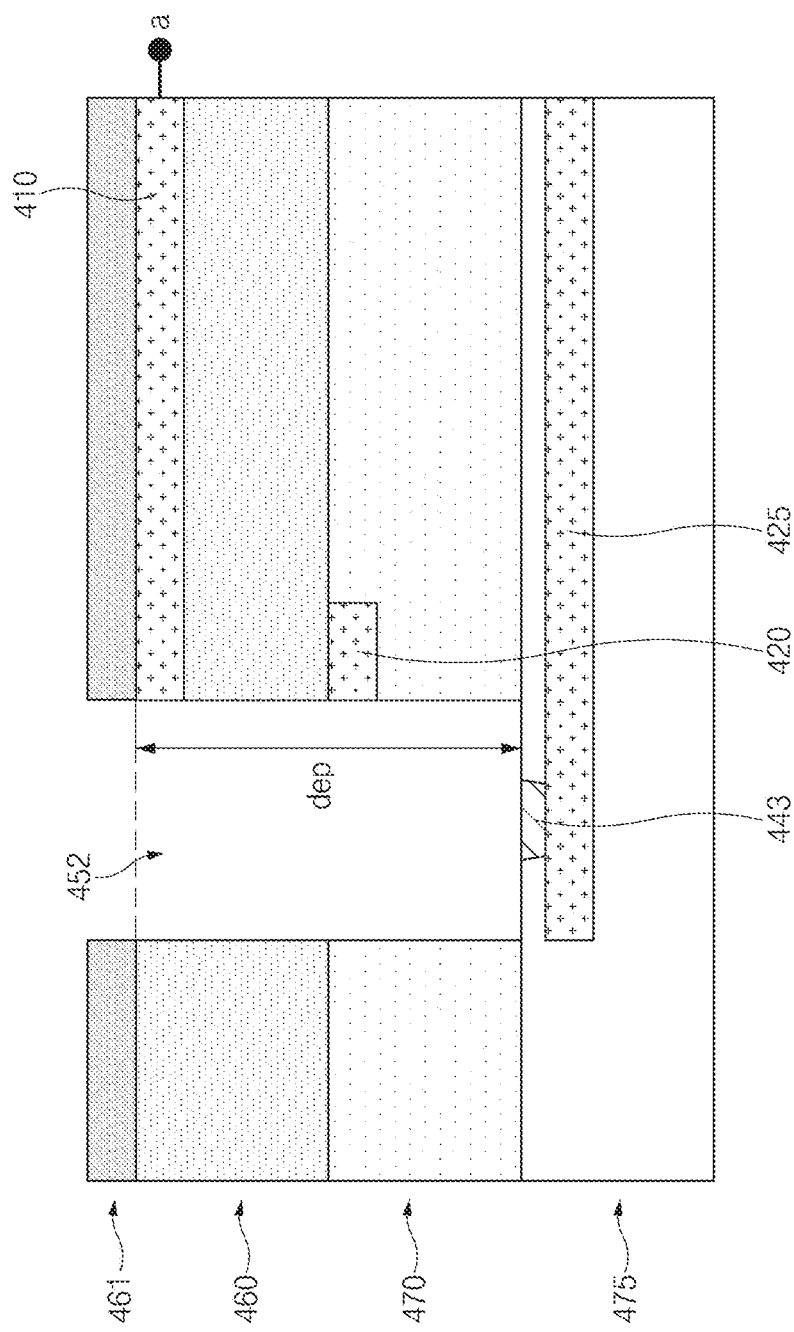
FIG. 7B illustrates a cross-sectional view showing a printed circuit board to explain a depth of a recess that electrically separates first, second, and third patterns according to an embodiment of the present disclosure.
Figure 7C:
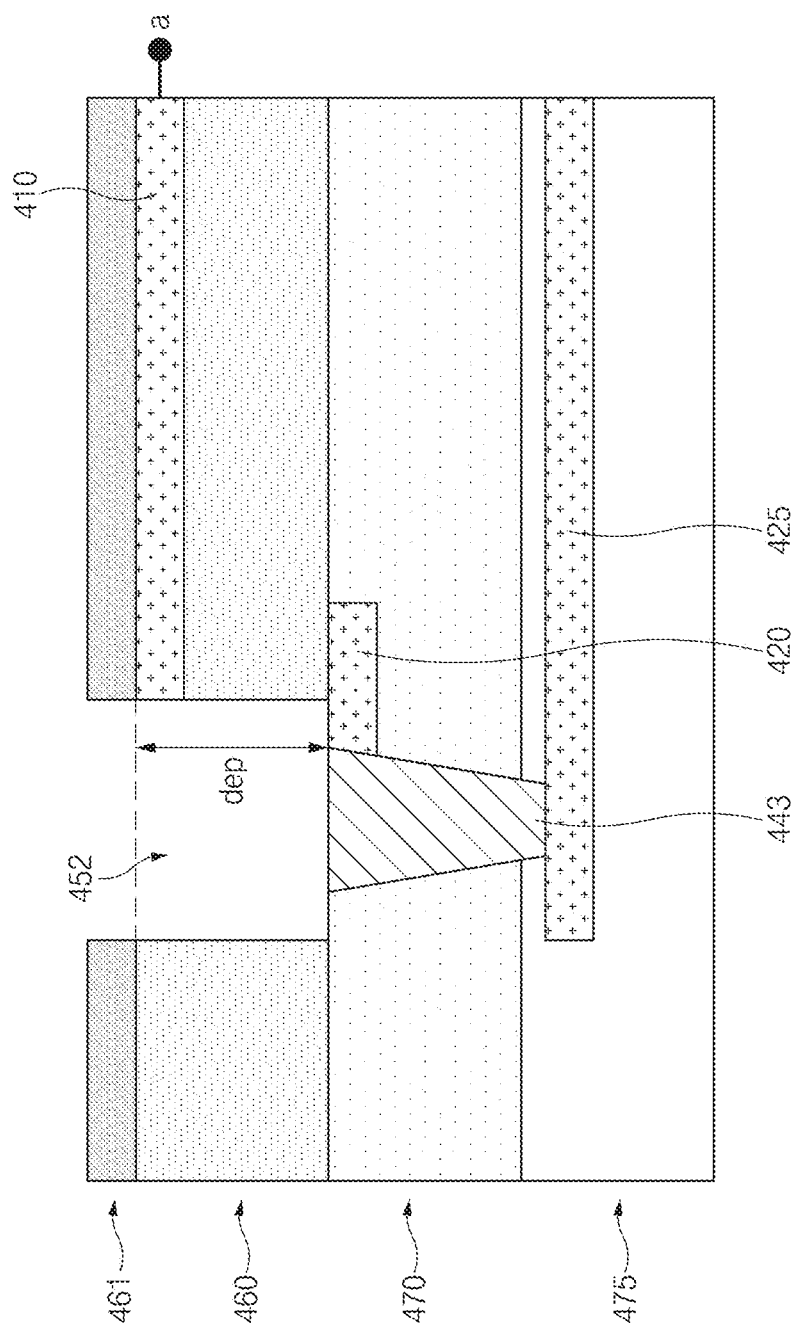
FIG. 7C illustrates a cross-sectional view showing a printed circuit board to explain a depth of a recess such that a first pattern is electrically separated from second and third patterns and the second and third patterns are not electrically separated from each other according to an embodiment of the present disclosure.

FIG. 6A illustrates a view showing a structure in which a via of a lower layer of a printed circuit board is connected to a second pattern according to an embodiment of the present disclosure, FIG. 6B illustrates a cross-sectional view showing a printed circuit board having a structure in which a via is connected to a second pattern according to an embodiment of the present disclosure, and FIG. 6C illustrates a cross-sectional view showing a printed circuit board to explain a depth of a recess formed in at least a portion of a via according to an embodiment of the present disclosure. FIG. 7A illustrates a cross-sectional view showing a printed circuit board having a structure in which a via is connected to first, second, and third patterns according to an embodiment of the present disclosure. FIG. 7B illustrates a cross-sectional view showing a printed circuit board to explain a depth of a recess that electrically separates first, second, and third patterns according to an embodiment of the present disclosure, and FIG. 7C illustrates a cross-sectional view showing a printed circuit board to explain a depth of a recess that electrically separates a first pattern from second and third patterns while the second pattern is not electrically separated from the third pattern according to an embodiment of the present disclosure. In FIGS. 5A to 7C, an "a" point may be a first end of a first pattern 410 connected to an electrolytic plating apparatus. FIGS. 5A to 7C show a structure in which the insulating material is not coated on the upper end of the via 443 of the printed circuit board 400.

As shown in FIGS. 5A to 5C, the via 443 according to the embodiment may be formed in the printed circuit board 400 to be included in not only the first pattern 410 but also in the second pattern 420. As an example, the via 443 may be formed such that at least ⅓ of a total area of a cross section of the via 443 in the lower layer 470 of the printed circuit board 400 overlaps with the second pattern 420. Referring to FIGS. 5A to 5C, since a center of the via 443 is located on a center line of the second pattern 420 in the lower layer 470 of the printed circuit board 400, the via 443 may be formed such that most of the via 443 overlaps with the second pattern 420. In this case, a depth dep2 of the recess 452 may be equal to or greater than the thickness of the first pattern 410 to disconnect the first pattern 410. In addition, the depth dep2 of the recess 452 may be equal to or smaller than the distance between the upper surface of the first pattern 410 and the upper surface of the second pattern 420 to prevent the second pattern 420 from being disconnected.

As shown in FIGS. 6A and 6B, the via 443 according to the embodiment may be formed such that most of the via 443 may deviate from the second pattern 420 in the lower layer 470 of the printed circuit board 400. As an example, the via 443 may be formed such that an area less than ⅓ of the total area of the cross section of the via 443 in the lower layer 470 of the printed circuit board 400 overlaps with the second pattern 420. Referring to FIG. 6A, the via 443 may be electrically connected to the second pattern 420 on a side surface of the second pattern 420 in the lower layer 470 of the printed circuit board 400. In this case, a depth dep3 of the recess 452 may be equal to or greater than a distance between the upper surface of the first pattern 410 and the lower surface of the second pattern 420 and equal to or smaller than a total thickness of the printed circuit board 400. However, the depth of the recess 452 may be changed depending on other patterns located under the second pattern 420 or a connection structure of the via 443. Hereinafter, the embodiment shown in FIGS. 7A to 7C will be described.

Referring to FIG. 7A, a printed circuit board 400 may include three layers 460, 470, and 475. A via 443 may be a via that electrically connects a second pattern 420 located at a second layer of the printed circuit board 400 and a third pattern 425 located at a third layer of the printed circuit board 400 to a first pattern 410 located at a first layer of the printed circuit board 400.

As an embodiment, in a case that the second pattern 420 and the third pattern 425 are different signal lines from each other, a recess 452 may be formed at a depth dep appropriate to electrically separate the first pattern 410, the second pattern 420, and the third pattern 425 from each other. For instance, as shown in FIG. 7B, the depth dep of the recess 452 may be equal to or greater than a distance between an upper surface of the first pattern 410 and a lower surface of the second pattern 420 and equal to or smaller than a distance between the upper surface of the first pattern 410 and an upper surface of the third pattern 425.

As another embodiment, in a case that the second pattern 420 and the third pattern 425 are signal lines located in a plurality of lower layers 470 and 475 of the printed circuit board 400, respectively, the recess 452 may be formed at a depth that electrically separates the first pattern 410 from the second pattern 420 while the second pattern 420 is not separated from the third pattern 425. As another example, the recess 452 may be formed at a depth at which the second pattern 420 is not exposed to an outside of the printed circuit board 400. As shown in FIG. 7C, the depth dep of the recess 452 may be equal to or greater than a thickness of the first pattern 410 and equal to or smaller than a distance between the upper surface of the first pattern 410 and an upper surface of the second pattern 420.

In the embodiment, the recess may be formed above the via such that the length of the dummy line for the plating connected to the signal line is reduced depending on the structure of the via and the routing pattern connected to the via, and thus the noises may be prevented from being introduced.

Figure 8A:
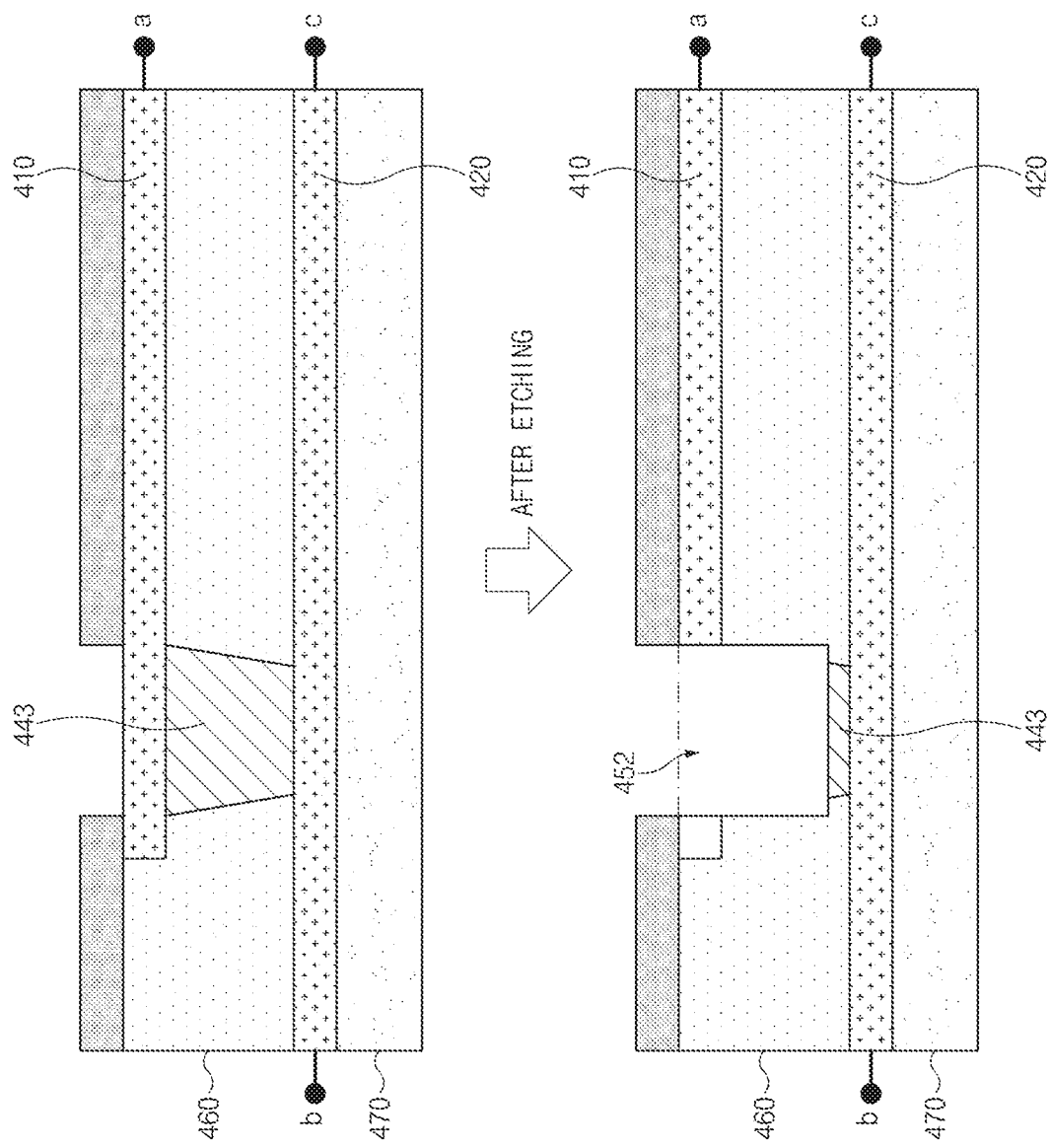
FIG. 8A illustrates a cross-sectional view showing a printed circuit board in which a width of a first pattern is equal to or smaller than a diameter of a recess according to an embodiment of the present disclosure.
Figure 8B:
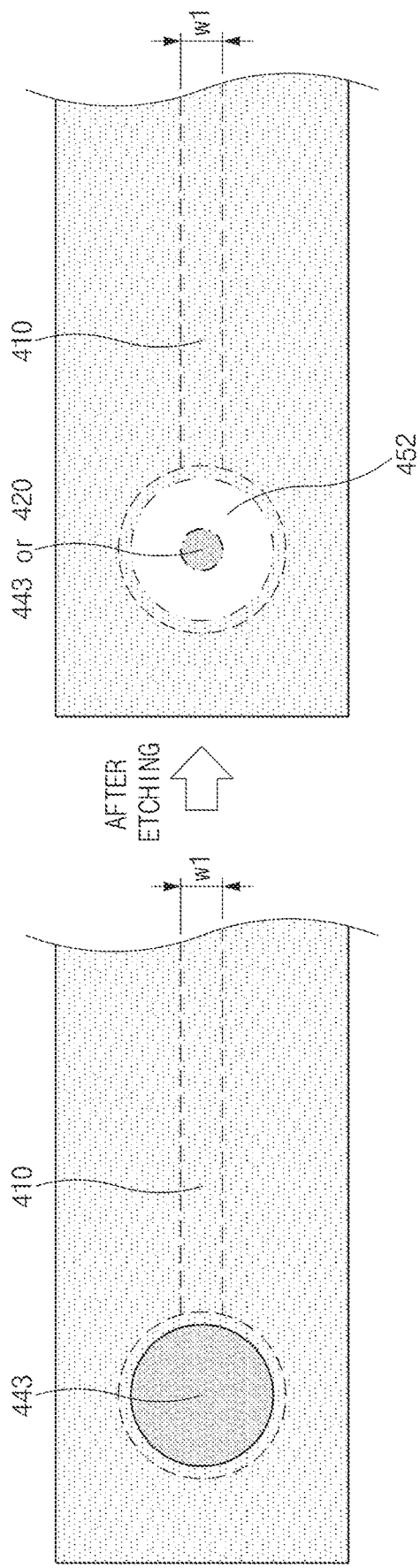
FIG. 8B illustrates a top view showing a printed circuit board in which a width of a first pattern is equal to or smaller than a diameter of a recess according to an embodiment of the present disclosure.
Figure 8C:
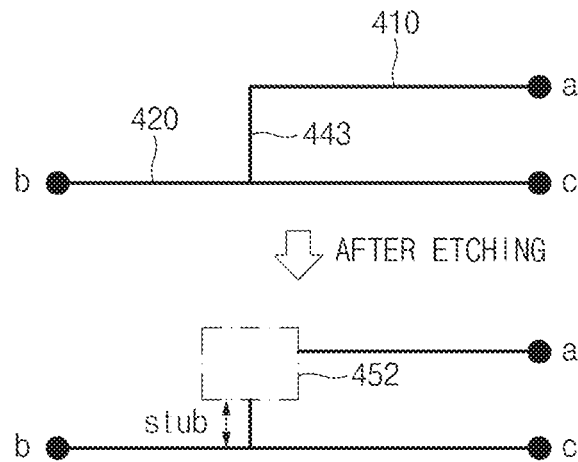
FIG. 8C illustrates an equivalent circuit diagram showing a connection relation between first and second patterns before and after forming a recess in a printed circuit board in which a width of a first pattern is equal to or smaller than a diameter of the recess according to an embodiment of the present disclosure.
Figure 8D:
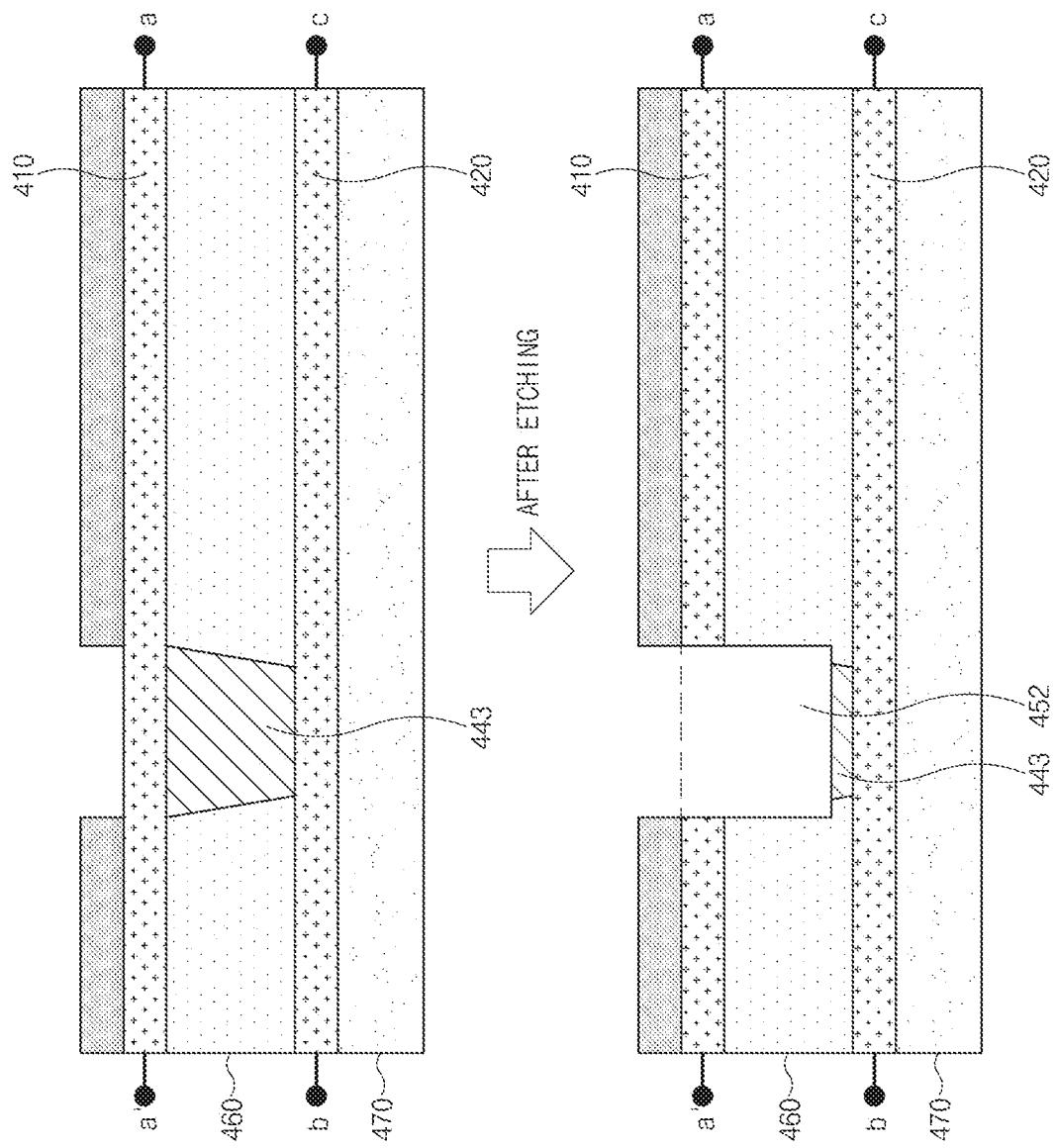
FIG. 8D illustrates a cross-sectional view showing a printed circuit board in which a width of a first pattern exceeds a diameter of a recess according to an embodiment of the present disclosure.
Figure 8E:
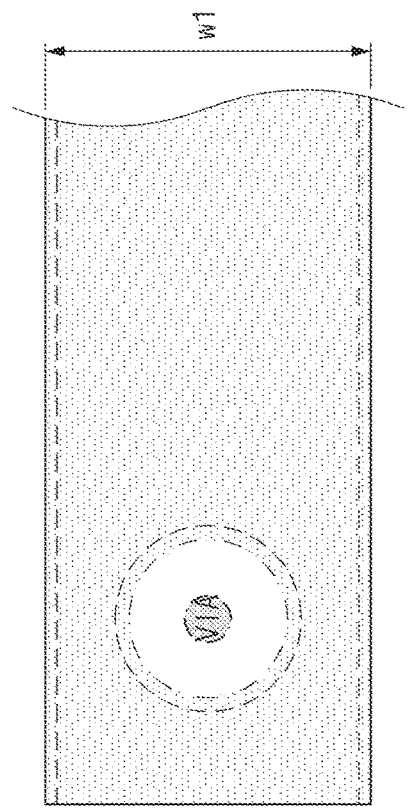
FIG. 8E illustrates a top view showing a printed circuit board in which a width of a first pattern exceeds a diameter of a recess according to an embodiment of the present disclosure.
Figure 8E:
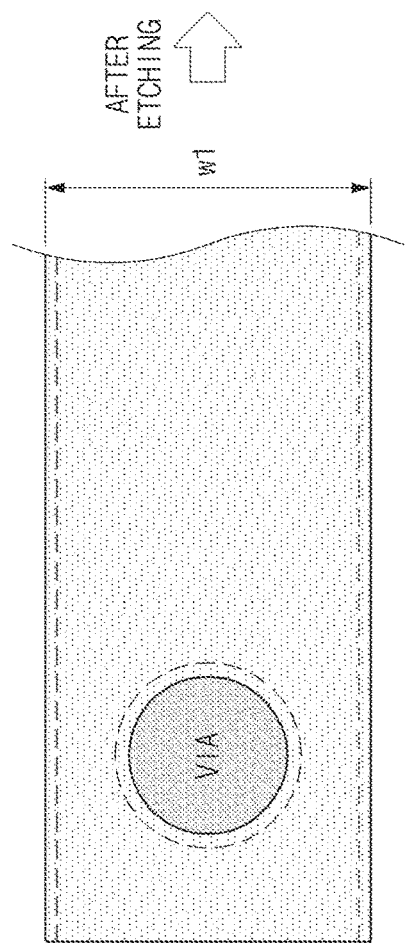
Figure 8F:
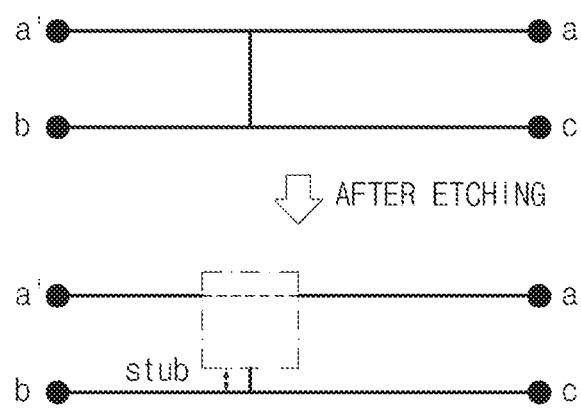
FIG. 8F illustrates an equivalent circuit diagram showing a connection relation between first and second patterns before and after forming a recess in a printed circuit board in which a width of a first pattern exceeds a diameter of a recess according to an embodiment of the present disclosure.

FIG. 8A illustrates a cross-sectional view showing a printed circuit board in which a width of a first pattern is equal to or smaller than a diameter of a recess according to an embodiment of the present disclosure, FIG. 8B illustrates a top view showing a printed circuit board in which a width of a first pattern is equal to or smaller than a diameter of a recess according to an embodiment of the present disclosure, and FIG. 8C illustrates an equivalent circuit diagram showing a connection relation between first and second patterns before and after forming a recess in a printed circuit board in which a width of a first pattern is equal to or smaller than a diameter of the recess according to an embodiment of the present disclosure. FIG. 8D illustrates a cross-sectional view showing a printed circuit board in which a width of a first pattern exceeds a diameter of a recess according to an embodiment of the present disclosure, FIG. 8E illustrates a top view showing a printed circuit board in which a width of a first pattern exceeds a diameter of a recess according to an embodiment of the present disclosure, and FIG. 8F illustrates an equivalent circuit diagram showing a connection relation between first and second patterns before and after forming a recess in a printed circuit board in which a width of a first pattern exceeds a diameter of a recess according to an embodiment of the present disclosure. FIGS. 8A to 8C show a structure in which a recess 452 is formed in a plating line with a width equal to or smaller than a diameter of the recess 452. In FIGS. 8A to 8C, an "a" point may be a first end of the first pattern 410 connected to an electrolytic plating apparatus. A "b" point may be a first end of the second pattern 420 connected to a first pad 431, and a "c" point may be a second end of the second pattern 420 connected to a second pad 432. The "b" point and the "c"

point may be connected to the first pad 431 and the second pad 432 through different vias 441 and 442 (refer to FIG. 4A), but for the convenience of explanation, a connection structure between the first and second pads 431 and 432 and the second pattern 420 is omitted in FIGS. 8A to 8F.

In a structure in which the first pattern 410 on an upper layer 460 of the printed circuit board is connected to the second pattern 420 of a lower layer 470 of the printed circuit board through the via 443 as shown in FIG. 8A, a width w1 of the first pattern 410 may be equal to or smaller than the diameter of the recess 452 as shown in FIG. 8B. In this case, the first end of the first pattern 410 may be disconnected by the recess 452 as shown in FIG. 8C.

In a structure in which the first pattern 410 on the upper layer 460 of the printed circuit board is connected to the second pattern 420 of the lower layer 470 of the printed circuit board through the via 443 as shown in FIG. 8D, the width w1 of the first pattern 410 may exceed the diameter of the recess 452 as shown in FIG. 8E. In this case, the first pattern 410 may not be disconnected by the recess 452 as shown in FIGS. 8E and 8F. As an example, the first pattern 410 may be a pattern having a wide width, such as a ground, a power line, etc. In a case that a pattern which is largely located on the printed circuit board, such as the grounds, the power lines, etc., is used as the first pattern 410, the dummy line for the plating may exert less influences on the routing of other signal lines.

According to an embodiment, the recess 452 may be formed in such a manner that the first pattern 410 is not disconnected regardless of the width of the first pattern 410. For instance, the recess 452 may be formed at a position at which the first pattern 410 is not disconnected. The recess 452 may be formed in the upper layer 460 of the printed circuit board 400 such that a portion of the recess 452, which is less than about ⅓ of a cross-sectional area of the recess 452, overlaps with the first pattern 410.

In an embodiment, the recess 452 may have various depths depending on the shape of the signal line connected to the via 443 and the connection relation with the dummy line. Accordingly, the length of the stubs, which are formed by the dummy line, may be reduced without interfering the connection of the signal line through the via 443.

Figure 9:
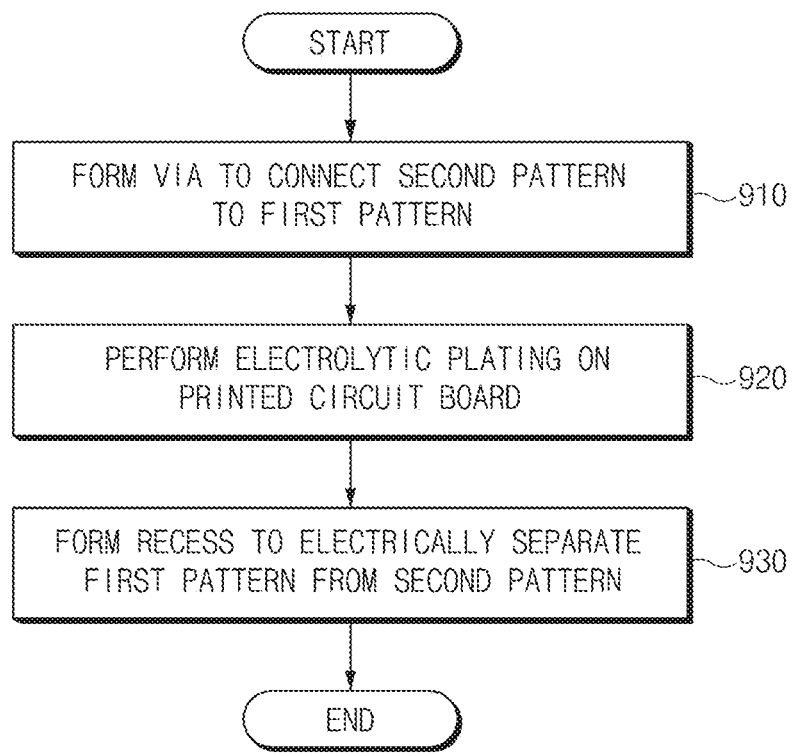
FIG. 9 illustrates a flowchart showing a method of manufacturing a printed circuit board according to an embodiment of the present disclosure.

FIG. 9 illustrates a flowchart showing a method of manufacturing a printed circuit board according to an embodiment of the present disclosure.

In operation 910, when the printed circuit board 400 is designed (e.g., an artwork), the via 443 may be formed such that the second pattern 420 formed in the lower layer 470 of the printed circuit board 400 is electrically connected to the first pattern 410 formed in the upper layer 460 of the printed circuit board 400. In operation 910, the insulating material may not be coated in the area of the upper layer 460 of the via 443, which is exposed to the outside of the printed circuit board 400.

In operation 920, the electrolytic plating may be performed on the printed circuit board 400 by applying the current to the first end of the first pattern 410 and immersing the printed circuit board 400 into an electrolytic soft plating solution. Since a method of electroplating the printed circuit board 400 is disclosed in a related art, details thereof will be omitted.

In operation 930, at least the portion of the area in which the via 443 of the printed circuit board 400 is formed may be removed, and thus the recess 452 may be formed to electrically separate the first pattern 410 from the second pattern 420. For instance, the recess 452 may be formed by etching the exposed area of the upper layer 460 of the printed circuit board 400 through the etching process (e.g., the etch back process). As another example, the recess 452 may be formed by the drill process that irradiates the laser beam on the upper portion (the portion formed in the lower layer) of the via 443. In operation 930, the depth of the recess 452 may be determined depending on the connection structure between the recess 452 and the first pattern 410 or between the recess 452 and the second pattern 420 and the shape of the second pattern 420. This is described with reference to FIGS. 5A to 7C, and thus details thereof will be omitted.

According to an embodiment, a printed circuit board includes a first pattern configured to be formed in a first layer; a second pattern configured to be formed in at least one second layer under the first layer; a via configured to electrically connect the first pattern to the second pattern; and a recess configured to be formed by removing at least a portion of an area in which the via is formed and to electrically separate the first pattern from the second pattern.

The recess is configured to have a diameter equal to or greater than a width of the first pattern and to have a depth smaller than a distance between an upper surface of the first pattern and an upper surface of the second pattern.

The recess is configured not to electrically separate the second pattern.

When the second pattern is configured to comprise one signal line formed in a plurality of the second layers and the one signal line is configured to be connected through the via, the recess is configured to be formed at a depth such that the first pattern and the second pattern are electrically separated from each other and the signal line formed in the plurality of the second layers is not electrically separated.

The via is configured to be formed such that an area less than ⅓ of a cross sectional area of the via overlaps with the second pattern in a connection layer that electrically connects the first pattern to the second pattern in the at least one second layer, and the recess is configured to be formed at a diameter not to disconnect the second pattern of the connection layer.

When the second pattern is configured to comprise different signal lines formed in a plurality of the second layers and the signal lines are configured to be connected through the via, the recess is configured to be formed at a depth such that the signal lines is electrically separated each other.

The via is configured to be formed such that an area equal to or greater than ⅓ of a cross sectional area of the via overlaps with the signal lines in the at least one second layer, and the recess is formed to have a diameter to disconnect the signal lines.

An insulating material is not coated in an area in which the via is formed in the first layer, and the recess is configured to be formed by etching the area.

The recess is formed to have a diameter smaller than a width of the first pattern such that the first pattern is not disconnected on the first layer.

The first pattern is configured to comprise at least one of a ground or a power line.

The recess is formed to have a diameter equal to or greater than a width of the first pattern such that the first pattern is disconnected on the first layer.

An insulating material is coated on an upper end of the recess.

According to an embodiment, the printed circuit board further includes at least one component element mounted on the first layer, wherein the first pattern is a dummy line to electrolytically-softly plate each pad of the component element, and the second pattern is a signal line of the component element.

The at least one pad is formed in the first layer, and each pin of the component element is wire-bonded to the pad corresponding to the each pin.

According to an embodiment, an electronic device includes a printed circuit board configured to mount an integrated module thereon; a memory configured to store instructions therein that controls the integrated module; and a processor configured to be electrically connected to the integrated module and configured to control the integrated module using the instructions, the printed circuit board configured to comprise: a first pattern configured to be formed in a first layer; a second pattern configured to be formed in at least one second layer under the first layer; a via configured to electrically connect the first pattern to the second pattern; and a recess configured to be formed by removing at least a portion of an area in which the via is formed and to electrically separate the first pattern from the second pattern.

The recess is configured to have a diameter equal to or greater than a width of the first pattern and to have a depth smaller than a distance between an upper surface of the first pattern and an upper surface of the second pattern.

The recess is configured not to electrically separate the second pattern.

The first pattern is a dummy line to electrolytically-softly plate each pad of the printed circuit board, and the second pattern is a signal line disposed on the printed circuit board.

A diameter of the recess is configured to exceed a width of the first pattern such that the first pattern is disconnected on the first layer.

The recess is formed to have a diameter smaller than a width of the first pattern such that the first pattern is not disconnected on the first layer.

Figure 10:
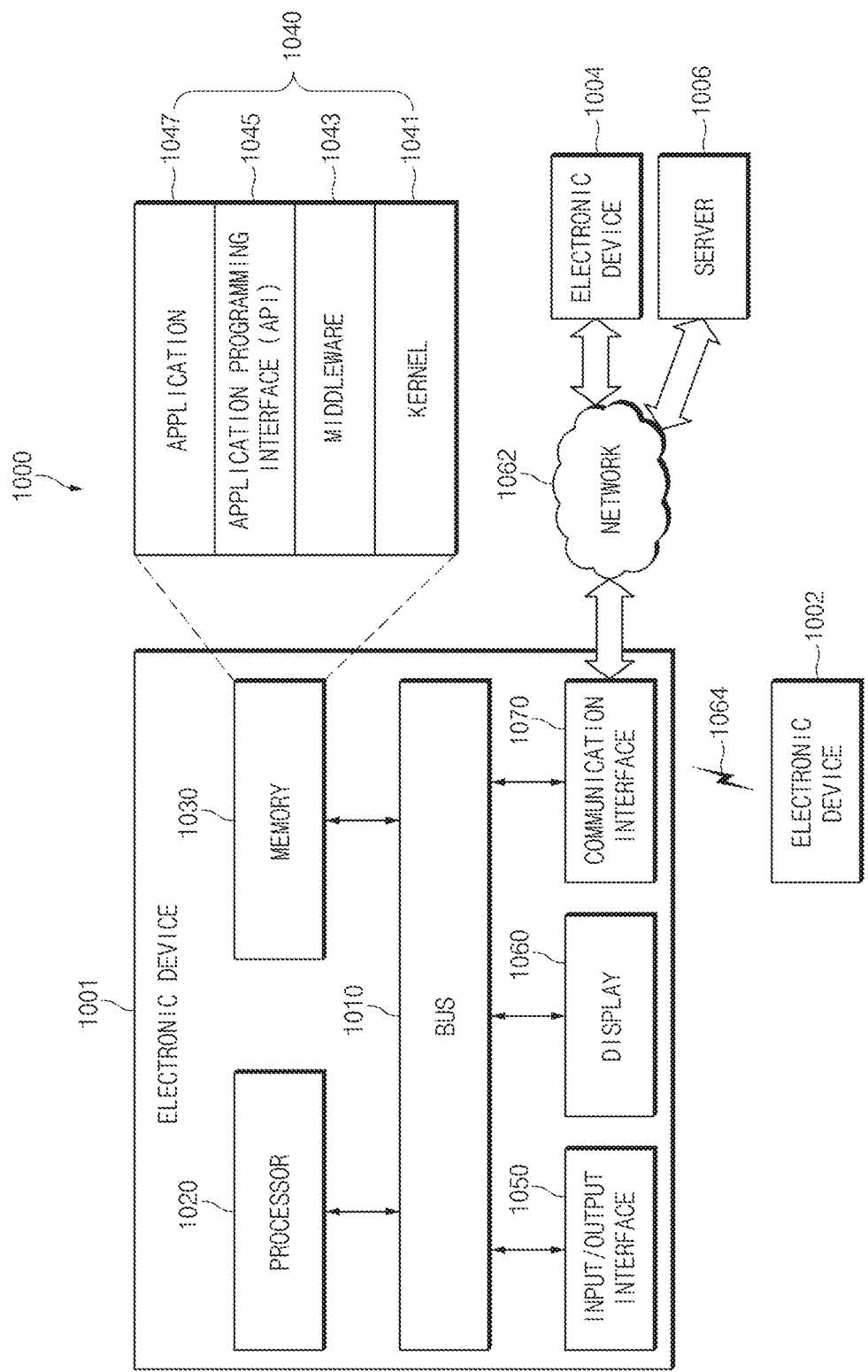
FIG. 10 illustrates a view showing an electronic device in a network environment according to an embodiment of the present disclosure.

FIG. 10 illustrates an electronic device in a network environment system, according to embodiment of the present disclosure.

Referring to FIG. 10, according to an embodiment of the present disclosure, an electronic device 1001, a first electronic device 1002, a second electronic device 1004, or a server 1006 may be connected each other over a network 1062 or a short range communication 1064. The electronic device 1001 includes a bus 1010, a processor 1020, a memory 1030, an input/output interface 1050, a display 1060, and a communication interface 1070. The electronic device 1001 may not include at least one of the above-described elements or may further include other element(s).

For example, the bus 1010 may interconnect the above-described elements 1010 to 1070 and may include a circuit for conveying communications (e.g., a control message and/or data) among the above-described elements.

The processor 1020 may include one or more of a central processing unit (CPU), an application processor (AP), or a communication processor (CP). For example, the processor 1020 may perform an arithmetic operation or data processing associated with control and/or communication of at least other elements of the electronic device 1001.

The memory 1030 may include a volatile and/or nonvolatile memory. For example, the memory 1030 may store instructions or data associated with at least one other element(s) of the electronic device 1001. According to an embodiment of the present disclosure, the memory 1030 stores software and/or a program 1040. The program 1040 includes, for example, a kernel 1041, a middleware 1043, an application programming interface (API) 1045, and/or an application program (or "an application") 1047. At least a part of the kernel 1041, the middleware 1043, or the API 1045 may be referred to as an operating system (OS).

For example, the kernel 1041 may control or manage system resources (e.g., the bus 1010, the processor 1020, the memory 1030, and the like) that are used to execute operations or functions of other programs (e.g., the middleware 1043, the API 1045, and the application 1047). Furthermore, the kernel 1041 may provide an interface that allows the middleware 1043, the API 1045, or the application 1047 to access discrete elements of the electronic device 1001 so as to control or manage system resources.

The middleware 1043 may perform, for example, a mediation role such that the API 1045 or the application 1047 communicates with the kernel 1041 to exchange data.

Furthermore, the middleware 1043 may process task requests received from the application 1047 according to a priority. For example, the middleware 1043 may assign the priority, which makes it possible to use a system resource (e.g., the bus 1010, the processor 1020, the memory 1030, and the like) of the electronic device 1001, to at least one of the application 1047. For example, the middleware 1043 may process the one or more task requests according to the priority assigned to the at least one, which makes it possible to perform scheduling or load balancing on the one or more task requests.

The API 1045 may be, for example, an interface through which the application 1047 controls a function provided by the kernel 1041 or the middleware 1043, and may include, for example, at least one interface or function (e.g., an instruction) for a file control, a window control, image processing, a character control, and the like.

The input/output interface 1050 may play a role, for example, of an interface which transmits an instruction or data input from a user or another external device, to other element(s) of the electronic device 1001. Furthermore, the input/output interface 1050 may output an instruction or data, received from other element(s) of the electronic device 1001, to a user or another external device.

The display 1060 may include, for example, a liquid crystal display (LCD), a light-emitting diode (LED) display, an organic LED (OLED) display, a microelectromechanical systems (MEMS) display, or an electronic paper display. The display 1060 may display, for example, various content (e.g., a text, an image, a video, an icon, a symbol, and the like) to a user. The display 1060 may include a touch screen and may receive, for example, a touch, gesture, proximity, or hovering input using an electronic pen or a part of a user's body.

The communication interface 1070 may establish communication between the electronic device 1001 and the first electronic device 1002, the second electronic device 1004, or the server 1006. For example, the communication interface 1070 may be connected to the network 1062 over wireless communication or wired communication to communicate with the second electronic device 1004 or the server 1006.

The wireless communication may use at least one of, for example, long-term evolution (LTE), LTE advanced (LTE-A), code division multiple access (CDMA), wideband CDMA (WCDMA), universal mobile telecommunications system (UMTS), wireless broadband (WiBro), global system for mobile communications (GSM), and the like, as cellular communication protocol. Furthermore, the wireless communication may include, for example, the short range communication 1064. The short range communication 1064 may include at least one of wireless fidelity (Wi-Fi), light fidelity (Li-Fi), Bluetooth, near field communication (NFC), magnetic stripe transmission (MST), a global navigation satellite system (GNSS), and the like.

The MST may generate a pulse in response to transmission data using an electromagnetic signal, and the pulse may generate a magnetic field signal. The electronic device 1001 may transfer the magnetic field signal to a POS terminal, and the POS terminal may detect the magnetic field signal using a MST reader. The POS may recover the data by converting the detected magnetic field signal to an electrical signal.

The GNSS may include at least one of, for example, a global positioning system (GPS), a global navigation satellite system (Glonass), a Beidou navigation satellite system (Beidou), or an European global satellite-based navigation system (Galileo) based on an available region, a bandwidth, and the like. Hereinafter, in the present disclosure, the terms "GPS" and "GNSS" may be interchangeably used. The wired communication may include at least one of, for example, a universal serial bus (USB), a high definition multimedia interface (HDMI), a recommended standard-232 (RS-232), a plain old telephone service (POTS), and the like. The network 1062 may include at least one of telecommunications networks, for example, a computer network (e.g., LAN or WAN), the Internet, or a telephone network.

Each of the first and second electronic devices 1002 and 1004 may be a device of which the type is different from or the same as that of the electronic device 1001. According to an embodiment of the present disclosure, the server 1006 may include a group of one or more servers. All or a portion of operations that the electronic device 1001 will perform may be executed by another or the first electronic device 1002, the second electronic device 1004 or the server 1006. In the case where the electronic device 1001 executes any function or service automatically or in response to a request, the electronic device 1001 may not perform the function or the service internally, but, alternatively additionally, it may request at least a portion of a function associated with the electronic device 1001 be performed with the electronic device 1002 or 1004 or the server 1006. The other electronic device may execute the requested function or additional function and may transmit the execution result to the electronic device 1001. The electronic device 1001 may provide the requested function or service using the received result or may additionally process the received result to provide the requested function or service. To this end, for example, cloud computing, distributed computing, or client-server computing may be used.

Figure 11:
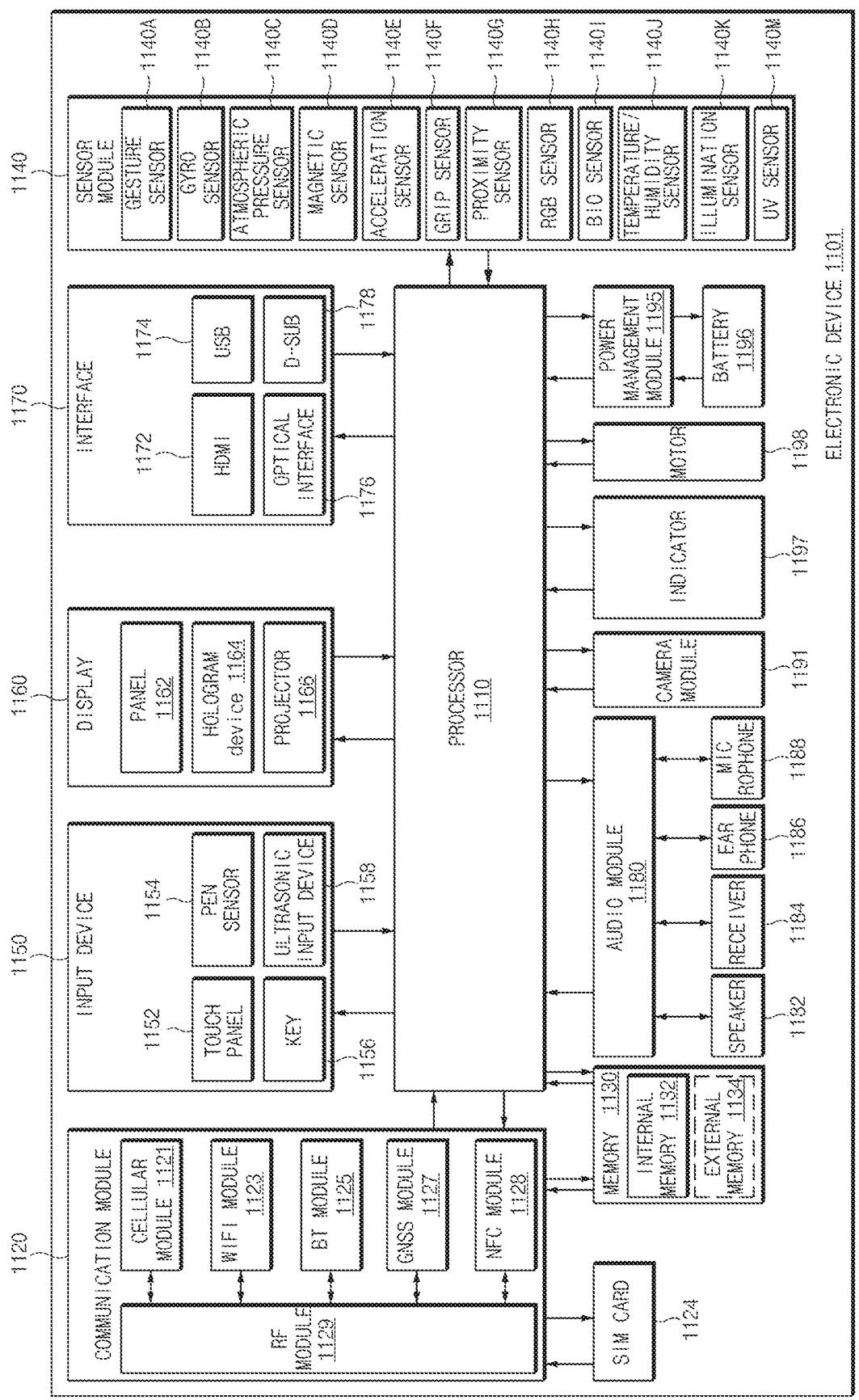
FIG. 11 illustrates a block diagram showing an electronic device according to an embodiment of the present disclosure.

FIG. 11 illustrates a block diagram of an electronic device, according to an embodiment of the present disclosure.

Referring to FIG. 11, an electronic device 1101 may include, for example, all or a part of the electronic device 1001 illustrated in FIG. 10. The electronic device 1101 includes one or more application processors AP 1110, a communication module 1120, a subscriber identification module 1129, a memory 1130, a sensor module 1140, an input device 1150, a display 1160, an interface 1170, an audio module 1180, a camera module 1191, a power management module 1195, a battery 1196, an indicator 1197, and a motor 1198.

The processor 1110 may drive, for example, an operating system (OS) or an application to control a plurality of hardware or software elements connected to the processor 1110 and may process and compute a variety of data. For example, the processor 1110 may be implemented with a system on chip. According to an embodiment of the present disclosure, the processor 1110 may further include a graphic processing unit (GPU) and/or an image signal processor. The processor 1110 may include at least a part (e.g., a cellular module 1121) of elements illustrated in FIG. 11. The processor 1110 may load an instruction or data, which is received from at least one of other elements (e.g., a nonvolatile memory), into a volatile memory and process the loaded instruction or data. The processor 1110 may store a variety of data in the nonvolatile memory.

The communication module 1120 may be configured the same as or similar to the communication interface 1070 of FIG. 10. The communication module 1120 includes the cellular module 1121, a Wi-Fi module 1122, a Bluetooth™ (BT) module 1123, a GNSS module 1124 (e.g., a GPS module, a Glonass module, a Beidou module, or a Galileo module), a near field communication (NFC) module 1125, a MST module 1126 and a radio frequency (RF) module 1127.

The cellular module 1121 may provide, for example, voice communication, video communication, a character service, an Internet service, and the like over a communication network. According to an embodiment of the present disclosure, the cellular module 1121 may perform discrimination and authentication of the electronic device 1101 within a communication network by using the subscriber identification module (e.g., a SIM card) 1129. The cellular module 1121 may perform at least a portion of functions that the processor 1110 provides. The cellular module 1121 may include a communication processor (CP).

Each of the Wi-Fi module 1122, the BT module 1123, the GNSS module 1124, the NFC module 1125, or the MST module 1126 may include a processor for processing data exchanged through a corresponding module, for example. According to an embodiment of the present disclosure, at least a part (e.g., two or more) of the cellular module 1121, the Wi-Fi module 1122, the BT module 1123, the GNSS module 1124, the NFC module 1125, or the MST module 1126 may be included within one integrated circuit (IC) or an IC package.

For example, the RF module 1127 may transmit and receive a communication signal (e.g., an RF signal). For example, the RF module 1127 may include a transceiver, a power amplifier module (PAM), a frequency filter, a low noise amplifier (LNA), an antenna, and the like. According to another embodiment of the present disclosure, at least one of the cellular module 1121, the Wi-Fi module 1122, the BT module 1123, the GNSS module 1124, the NFC module 1125, or the MST module 1126 may transmit and receive an RF signal through a separate RF module.

The subscriber identification module 1129 may include, for example, a card and/or embedded SIM that includes a subscriber identification module and may include unique identify information (e.g., integrated circuit card identifier (ICCID)) or subscriber information (e.g., integrated mobile subscriber identity (IMSI)).

The memory 1130 (e.g., the memory 1030) includes an internal memory 1132 or an external memory 1134. For example, the internal memory 1132 may include at least one of a volatile memory (e.g., a dynamic random access memory (DRAM), a static RAM (SRAM), a synchronous DRAM (SDRAM), and the like), a nonvolatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a flash memory (e.g., a NAND flash memory or a NOR flash memory), and the like), a hard drive, or a solid state drive (SSD).

The external memory 1134 may further include a flash drive such as compact flash (CF), secure digital (SD), micro secure digital (micro-SD), mini secure digital (mini-SD), extreme digital (xD), a multimedia card (MMC), a memory stick, and the like. The external memory 1134 may be operatively and/or physically connected to the electronic device 1101 through various interfaces.

A security module 1136 may be a module that includes a storage space of which a security level is higher than that of the memory 1130 and may be a circuit that guarantees safe data storage and a protected execution environment. The security module 1136 may be implemented with a separate circuit and may include a separate processor. For example, the security module 1136 may be in a smart chip or a secure digital (SD) card, which is removable, or may include an embedded secure element (eSE) embedded in a fixed chip of the electronic device 1101. Furthermore, the security module 1136 may operate based on an operating system (OS) that is different from the OS of the electronic device 1101. For example, the security module 1136 may operate based on java card open platform (JCOP) OS.

The sensor module 1140 may measure, for example, a physical quantity or may detect an operation state of the electronic device 1101. The sensor module 1140 may convert the measured or detected information to an electric signal. For example, the sensor module 1140 includes at least one of a gesture sensor 1140A, a gyro sensor 1140B, a barometric pressure sensor 1140C, a magnetic sensor 1140D, an acceleration sensor 1140E, a grip sensor 1140F, the proximity sensor 1140G, a color sensor 1140H (e.g., red, green, blue (RGB) sensor), a biometric sensor 1140I, a temperature/humidity sensor 1140J, an illuminance sensor 1140K, or an UV sensor 1140M. The sensor module 1140 may further include, for example, an E-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 1140 may further include a control circuit for controlling at least one or more sensors included therein. According to an embodiment of the present disclosure, the electronic device 1101 may further include a processor that is a part of the processor 1110 or independent of the processor 1110 and is configured to control the sensor module 1140. The processor may control the sensor module 1140 while the processor 1110 remains at a sleep state.

The input device 1150 includes, for example, a touch panel 1152, a (digital) pen sensor 1154, a key 1156, or an ultrasonic input unit 1158. For example, the touch panel 1152 may use at least one of capacitive, resistive, infrared and ultrasonic detecting methods. Also, the touch panel 1152 may further include a control circuit. The touch panel 1152 may further include a tactile layer to provide a tactile reaction to a user.

The (digital) pen sensor 1154 may be, for example, a part of a touch panel or may include an additional sheet for recognition. The key 1156 may include, for example, a physical button, an optical key, a keypad, and the like. The ultrasonic input device 1158 may detect (or sense) an ultrasonic signal, which is generated from an input device, through a microphone 1188 and may check data corresponding to the detected ultrasonic signal.

The display 1160 (e.g., the display 1060) may include a panel 1162, a hologram device 1164, or a projector 1166. The panel 1162 may be the same as or similar to the display 1060 illustrated in FIG. 10. The panel 1162 may be implemented, for example, to be flexible, transparent or wearable. The panel 1162 and the touch panel 1152 may be integrated into a single module. The hologram device 1164 may display a stereoscopic image in a space using a light interference phenomenon. The projector 1166 may project light onto a screen so as to display an image. For example, the screen may be arranged in the inside or the outside of the electronic device 1101. According to an embodiment of the present disclosure, the display 1160 may further include a control circuit for controlling the panel 1162, the hologram device 1164, or the projector 1166.

The interface 1170 includes, for example, a high-definition multimedia interface (HDMI) 1172, a universal serial bus (USB) 1174, an optical interface 1176, or a D-subminiature (D-sub) 1178. The interface 1170 may be included, for example, in the communication interface 1070 illustrated in FIG. 10. Additionally or generally, the interface 1170 may include, for example, a mobile high definition link (MHL) interface, a SD card/multi-media card (MMC) interface, or an infrared data association (IrDA) standard interface.

The audio module 1180 may convert a sound and an electric signal in dual directions. At least a part of the audio module 1180 may be included, for example, in the input/output interface 1050 illustrated in FIG. 10. The audio module 1180 may process, for example, sound information that is input or output through a speaker 1182, a receiver 1184, an earphone 1186, or the microphone 1188.

The camera module 1191 may shoot a still image or a video. According to an embodiment of the present disclosure, the camera module 1191 may include at least one or more image sensors (e.g., a front sensor or a rear sensor), a lens, an image signal processor (ISP), or a flash (e.g., an LED or a xenon lamp).

The power management module 1195 may manage, for example, power of the electronic device 1101. According to an embodiment of the present disclosure, a power management integrated circuit (PMIC), a charger IC, or a battery gauge may be included in the power management module 1195. The PMIC may have a wired charging method and/or a wireless charging method. The wireless charging method may include, for example, a magnetic resonance method, a magnetic induction method or an electromagnetic method and may further include an additional circuit, for example, a coil loop, a resonant circuit, or a rectifier, and the like. The battery gauge may measure, for example, a remaining charge capacity of the battery 1196 and a voltage, current or temperature thereof while the battery is charged. The battery 1196 may include, for example, a rechargeable battery and/or a solar battery.

The indicator 1197 may display a specific state of the electronic device 1101 or a part thereof (e.g., the processor 1110), such as a booting state, a message state, a charging state, and the like. The motor 1198 may convert an electrical signal into a mechanical vibration and may generate the following effects: vibration, haptic, and the like. A processing device (e.g., a GPU) for supporting a mobile TV may be included in the electronic device 1101. The processing device for supporting the mobile TV may process media data according to the standards of digital multimedia broadcasting (DMB), digital video broadcasting (DVB), MediaFlo™, and the like.

Each of the above-mentioned elements of the electronic device according to an embodiment of the present disclosure may be configured with one or more components, and the names of the elements may vary according to the type of the electronic device. The electronic device may include at least one of the above-mentioned elements, and some elements may be omitted or other additional elements may be added. Furthermore, some of the elements of the electronic device may be combined with each other so as to form one entity, so that the functions of the elements may be performed in the same manner as before the combination.

Figure 12:
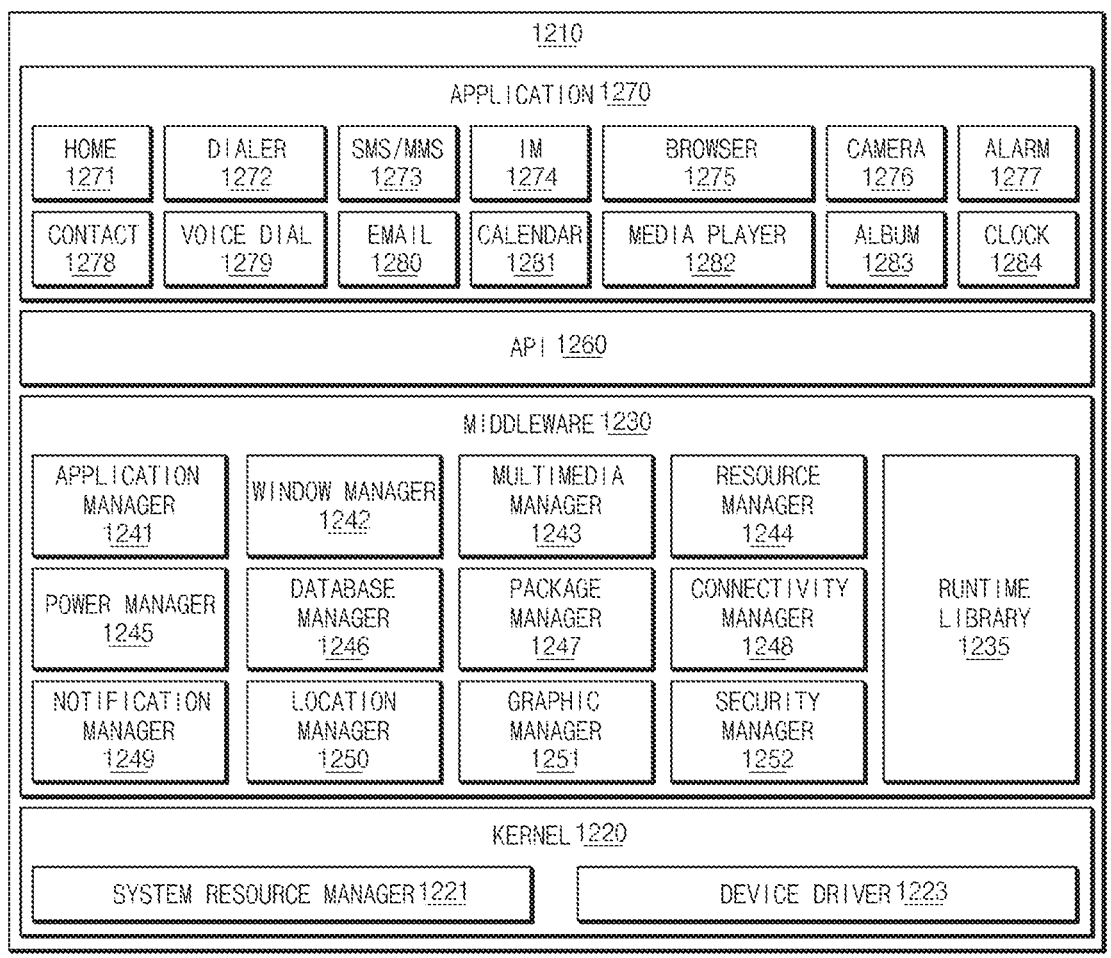
FIG. 12 illustrates a block diagram showing a program module according to an embodiment of the present disclosure.

FIG. 12 illustrates a block diagram of a program module, according to an embodiment of the present disclosure.

According to an embodiment of the present disclosure, a program module 1210 (e.g., the program 1040) may include an operating system (OS) to control resources associated with the electronic device 1001, and/or diverse applications (e.g., the application program 1047) driven on the OS. The OS may be, for example, Android™, iOS™, Windows™, Symbian™, or Tizen™.

The program module 1210 includes a kernel 1220, a middleware 1230, an application programming interface (API) 1260, and/or an application 1270. At least a portion of the program module 1210 may be preloaded on an electronic device or may be downloadable from the first electronic device 1002, the second electronic device 1004, the server 1006, and the like.

The kernel 1220 (e.g., the kernel 1041) includes, for example, a system resource manager 1221 or a device driver 1223. The system resource manager 1221 may perform control, allocation, or retrieval of system resources. According to an embodiment of the present disclosure, the system resource manager 1221 may include a process managing unit, a memory managing unit, or a file system managing unit. The device driver 1223 may include, for example, a display driver, a camera driver, a Bluetooth driver, a shared memory driver, a USB driver, a keypad driver, a Wi-Fi driver, an audio driver, or an inter-process communication (IPC) driver.

The middleware 1230 may provide, for example, a function that the application 1270 needs in common, or may provide diverse functions to the application 1270 through the API 1260 to allow the application 1270 to efficiently use limited system resources of the electronic device. According to an embodiment of the present disclosure, the middleware 1230 (e.g., the middleware 1043) includes at least one of a runtime library 1235, an application manager 1241, a window manager 1242, a multimedia manager 1243, a resource manager 1244, a power manager 1245, a database manager 1246, a package manager 1247, a connectivity manager 1248, a notification manager 1249, a location manager 1250, a graphic manager 1251, or a security manager 1252.

The runtime library 1235 may include, for example, a library module that is used by a compiler to add a new function through a programming language while the application 1270 is being executed. The runtime library 1235 may perform input/output management, memory management, or capacities about arithmetic functions.

The application manager 1241 may manage, for example, a life cycle of at least one application of the application 1270. The window manager 1242 may manage a graphic user interface (GUI) resource that is used in a screen. The multimedia manager 1243 may identify a format necessary for playing diverse media files, and may perform encoding or decoding of media files by using a codec suitable for the format. The resource manager 1244 may manage resources such as a storage space, memory, or source code of at least one application of the application 1270.

For example, the power manager 1245 may operate with a basic input/output system (BIOS) and the like to manage capacity, temperature, or power of a battery, and may determine or provide power information for an operation of an electronic device by using the corresponding information thereof. The database manager 1246 may generate, search for, or modify database that is to be used in at least one application of the application 1270. The package manager 1247 may install or update an application that is distributed in the form of package file.

The connectivity manager 1248 may manage, for example, wireless connection such as Wi-Fi or Bluetooth. The notification manager 1249 may display or notify an event such as arrival message, appointment, or proximity notification in a mode that does not disturb a user. The location manager 1250 may manage location information about an electronic device. The graphic manager 1251 may manage a graphic effect that is provided to a user, or manage a user interface relevant thereto. The security manager 1252 may provide a general security function necessary for system security, user authentication, and the like. According to an embodiment of the present disclosure, in the case where an electronic device 1001 includes a telephony function, the middleware 1230 may further include a telephony manager for managing a voice or video call function of the electronic device.

The middleware 1230 may include a middleware module that combines diverse functions of the above-described elements. The middleware 1230 may provide a module specialized to each OS type to provide differentiated functions. Additionally, the middleware 1230 may dynamically remove a part of the preexisting elements or may add new elements thereto.

The API 1260 may be, for example, a set of programming functions and may be provided with a configuration that is variable depending on an OS. For example, in the case where an OS is Android or iOS™, it may provide one API set per platform. In the case where an OS is Tizen™, it may provide two or more API sets per platform.

The application 1270 includes, for example, one or more applications capable of providing functions for a home 1271, a dialer 1272, an SMS/MMS 1273, an instant message (IM) 1274, a browser 1275, a camera 1276, an alarm 1277, a contact 1278, a voice dial 1279, an e-mail 1280, a calendar 1281, a media player 1282, an album 1283, a timepiece 1284, and a payment 1285 or for offering health care (e.g., measuring an exercise quantity, blood sugar level, and the like) or environment information (e.g., information of barometric pressure, humidity, temperature, and the like).

According to an embodiment of the present disclosure, the application 1270 may include an information exchanging application to support information exchange between the electronic device 1001 and the first electronic device 1002 or the second electronic device 1004. The information exchanging application may include, for example, a notification relay application for transmitting specific information to an external electronic device, or a device management application for managing the external electronic device.

For example, the notification relay application may include a function of transmitting notification information, which arise from other applications (e.g., applications for SMS/MMS, e-mail, health care, or environmental information), to an external electronic device. Additionally, the information exchanging application may receive, for example, notification information from an external electronic device and provide the notification information to a user.

The device management application may manage (e.g., install, delete, or update), for example, at least one function (e.g., turn-on/turn-off of an external electronic device itself (or a part of elements) or adjustment of brightness (or resolution) of a display) of the external electronic device which communicates with the electronic device, an application running in the external electronic device, or a service (e.g., a call service, a message service, and the like) provided from the external electronic device.

According to an embodiment of the present disclosure, the application 1270 may include an application (e.g., a health care application of a mobile medical device) that is assigned in accordance with an attribute of an external electronic device. According to an embodiment, the application 1270 may include an application that is received from the first electronic device 1002, the second electronic device 1004, or the server 1006. The application 1270 may include a preloaded application or a third party application that is downloadable from a server. The names of elements of the program module 1210 may be modifiable depending on kinds of operating systems.

According to an embodiment of the present disclosure, at least a portion of the program module 1210 may be implemented by software, firmware, hardware, or a combination of two or more thereof. At least a portion of the program module 1210 may be implemented (e.g., executed), for example, by the processor 1110. At least a portion of the program module 1210 may include, for example, modules, programs, routines, sets of instructions, processes, and the like for performing one or more functions.

The term "module" as used in the present disclosure may represent, for example, a unit including one or more combinations of hardware, software and firmware. The term "module" may be interchangeably used with the terms "unit", "logic", "logical block", "component" and "circuit". The "module" may be a minimum unit of an integrated component or may be a part thereof. The "module" may be a minimum unit for performing one or more functions or a part thereof. The "module" may be implemented mechanically or electronically. For example, the "module" may include at least one of an application-specific IC (ASIC) chip, a field-programmable gate array (FPGA), and a programmable-logic device for performing some operations, which are known or will be developed.

At least a part of an apparatus (e.g., modules or functions thereof) or a method (e.g., operations) according to an embodiment of the present disclosure may be, for example, implemented by instructions stored in a computer-readable storage media in the form of a program module. The instruction, when executed by a processor 10, may cause the one or more processors to perform a function corresponding to the instruction. The computer-readable storage media, for example, may be the memory 30.

A computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), and hardware devices (e.g., a read only memory (ROM), a random access memory (RAM), or a flash memory). Also, a program instruction may include not only a mechanical code such as generated by a compiler but also a high-level language code executable on a computer using an interpreter. The above hardware unit may be configured to operate via one or more software modules for performing an operation according to an embodiment of the present disclosure, and vice versa.

A module or a program module according to an embodiment of the present disclosure may include at least one of the above elements, or a part of the above elements may be omitted, or additional other elements may be further included. Operations performed by a module, a program module, or other elements may be executed sequentially, in parallel, repeatedly, or in a heuristic method. In addition, some operations may be executed in different sequences or may be omitted. Alternatively, other operations may be added.

While the present disclosure has been shown and described with reference to various embodiments thereof, it will be understood by those skilled in the art that various changes in form and details may be made therein without departing from the spirit and scope of the present disclosure as defined by the appended claims and their equivalents.

Although the present disclosure has been described with an exemplary embodiment, various changes and modifications may be suggested to one skilled in the art. It is intended that the present disclosure encompass such changes and modifications as fall within the scope of the appended claims.

What is claimed is:
1. A printed circuit board comprising:
    a first pattern configured to be formed in a first layer, wherein the first layer is a ground layer or a power layer;
    a second pattern formed in a second layer under the first layer, wherein the second layer is a signal layer;
    a first signal pad disposed on an outer layer of the printed circuit board;
    a second signal pad disposed on the outer layer of the printed circuit board;
    a first signal via configured to electrically connect the first signal pad to the second pattern;
    a second signal via configured to electrically connect the second signal pad to the second pattern;
    a third via configured to electrically connect the first pattern to the second pattern, wherein the third via connects the ground layer or the power layer to the signal layer; and
    a recess formed by removing at least a portion of an area where the third via is formed and configured to electrically separate the first pattern from the second pattern, wherein the ground layer or the power layer is electrically separate from the signal layer, and wherein the first signal pad and the second signal pad remain electrically connected through the signal layer after the recess is formed.

2. The printed circuit board of claim 1, wherein the recess is configured to include a diameter equal to or greater than a width of the first pattern.

3. The printed circuit board of claim 1, wherein the recess is configured to have a depth smaller than a distance between an upper surface of the first pattern and an upper surface of the second pattern.

4. The printed circuit board of claim 1, further comprising a third pattern is configured to be formed in a third layer under the second layer and to electrically connected the second pattern through the third via,
    wherein the recess is configured to be formed at a depth such that the first pattern and the second pattern are electrically separated from each other and the second pattern and the third pattern are not electrically separated.

5. The printed circuit board of claim 1, wherein the recess is configured not to disconnect the second pattern on the second layer.

6. The printed circuit board of claim 1, wherein, when the second pattern is configured to comprise different signal lines formed in a plurality of layers including the second layer and the signal lines are configured to be connected through the third via, the recess is configured to be formed at a depth such that the signal lines are electrically separated from each other.

7. The printed circuit board of claim 6, wherein the third via is configured to be formed such that an area equal to or greater than ⅓ of a cross sectional area of the third via overlaps with the signal lines in the layers, and the recess is formed to include a diameter to disconnect the signal lines.

8. The printed circuit board of claim 1, wherein an insulating material is not coated in an area where the third via is formed in the first layer, and the recess is configured to be formed by etching the area.

9. The printed circuit board of claim 1, wherein the recess is formed to include a diameter smaller than a width of the first pattern such that the first pattern is not disconnected on the first layer.

10. The printed circuit board of claim 9, wherein the first pattern is configured to comprise at least one of a ground or a power line.

11. The printed circuit board of claim 1, wherein the recess is formed to include a diameter equal to or greater than a width of the first pattern such that the first pattern is disconnected on the first layer.

12. The printed circuit board of claim 1, wherein an insulating material is coated on an upper end of the recess.

13. The printed circuit board of claim 1, further comprising at least one component element mounted on the first layer, wherein the first pattern includes a dummy line to electrolytically-softly plate at least one pad of the component element, and the second pattern is a signal line of the component element.

14. The printed circuit board of claim 13, wherein the at least one pad is formed in the first layer, and each pin of the component element is wire-bonded to one of the at least one pad corresponding to the each pin.

15. An electronic device comprising:
a printed circuit board configured to mount an integrated module thereon;
a memory configured to store instructions therein that controls the integrated module; and
a processor configured to be electrically connected to the integrated module and configured to control the integrated module using the instructions, the printed circuit board configured to comprise:
a first pattern configured to be formed in a first layer, wherein the first layer is a ground layer or a power layer;
a first signal pad disposed on an outer layer of the printed circuit board;
a second pattern formed in a second layer under the first layer, wherein the second layer is a signal layer;
a second signal pad disposed on the outer layer of the printed circuit board;
a first signal via configured to electrically connect the first signal pad to the second pattern;
a second signal via configured to electrically connect the second signal pad to the second pattern;
a third via configured to electrically connect the first pattern to the second pattern, wherein the third via connects the ground layer or the power layer to the signal layer; and
a recess formed by removing at least a portion of an area where the third via is formed, and configured to electrically separate the first pattern from the second pattern, wherein the ground layer or the power layer is electrically separate from the signal layer, and wherein the first signal pad and the second signal pad remain electrically connected through the signal layer after the recess is formed.

16. The electronic device of claim 15, wherein the recess is configured to include a diameter equal to or greater than a width of the first pattern.

17. The electronic device of claim 15, wherein the recess is configured to have a depth smaller than a distance between an upper surface of the first pattern and an upper surface of the second pattern.

18. The electronic device of claim 15, wherein the first pattern includes a dummy line to electrolytically-softly plate each pad of the printed circuit board, and the second pattern is a signal line disposed on the printed circuit board.

19. The electronic device of claim 15, wherein a diameter of the recess is configured to exceed a width of the first pattern such that the first pattern is disconnected on the first layer.

20. The electronic device of claim 15, wherein the recess is formed to include a diameter smaller than a width of the first pattern such that the first pattern is not disconnected on the first layer.

* * * * *